(12) United States Patent
Fu et al.

(10) Patent No.: US 11,282,470 B2
(45) Date of Patent: Mar. 22, 2022

(54) SHIFT REGISTER ELEMENT, METHOD FOR DRIVING THE SAME, GATE DRIVER CIRCUIT, AND DISPLAY DEVICE

(71) Applicants: Ordos Yuansheng Optoelectronics Co., Ltd., Inner Mongolia (CN); BOE Technology Group Co., Ltd., Beijing (CN)

(72) Inventors: Yishan Fu, Beijing (CN); Jun Fan, Beijing (CN); Han Zhang, Beijing (CN); Fuqiang Li, Beijing (CN)

(73) Assignees: Ordos Yuansheng Optoelectronics Co., Ltd.; BOE Technology Group Co., Ltd., Beijing (CN)

( * ) Notice: Subject to any disclaimer, the term of this patent is extended or adjusted under 35 U.S.C. 154(b) by 412 days.

(21) Appl. No.: 16/327,704

(22) PCT Filed: Aug. 1, 2018

(86) PCT No.: PCT/CN2018/098168
§ 371 (c)(1),
(2) Date: Feb. 22, 2019

(87) PCT Pub. No.: WO2019/080572
PCT Pub. Date: May 2, 2019

(65) Prior Publication Data
US 2021/0183326 A1 Jun. 17, 2021

(30) Foreign Application Priority Data
Oct. 27, 2017 (CN) .......................... 201711056832.5

(51) Int. Cl.
*G09G 3/20* (2006.01)
*G09G 3/36* (2006.01)
*G11C 19/28* (2006.01)

(52) U.S. Cl.
CPC ........... *G09G 3/3677* (2013.01); *G11C 19/28* (2013.01); *G09G 2300/0426* (2013.01); *G09G 2310/0286* (2013.01); *G09G 2310/08* (2013.01)

(58) Field of Classification Search
CPC ................. G09G 3/20; G09G 2310/08; G09G 2300/0426; G09G 2310/0267; G09G 3/36;
(Continued)

(56) References Cited

U.S. PATENT DOCUMENTS 11,100,841 B2 * 8/2021 Wang .................. G09G 3/2092
11,120,746 B2 * 9/2021 Feng ........................ G09G 3/36
(Continued)

FOREIGN PATENT DOCUMENTS

CN 105118418 A 12/2015
CN 105788555 A 7/2016
(Continued)

OTHER PUBLICATIONS

Office Action for corresponding Chinese Application 201711056832.5 dated Apr. 11, 2019.
(Continued)

*Primary Examiner* — Olga V Merkoulova
(74) *Attorney, Agent, or Firm* — Arent Fox LLP; Michael Fainberg

(57) ABSTRACT

This disclosure discloses a shift register element, a method for driving the same, a gate driver circuit, and a display device. The shift register element comprises a first input circuit, a second input circuit, a first node control circuit, a second node control circuit, a third node control circuit, and N output circuits, where the first input circuit, the second input circuit, and the first node control circuit are configured to control a first node, the second node control circuit is
(Continued)

configured to control a second node so that the third node control circuit controls the third node according to the first node and the second node, and the N output circuits control corresponding output terminals according to corresponding clock signal terminals under the control of the first node.

16 Claims, 15 Drawing Sheets

(58) Field of Classification Search
CPC ......... G09G 2330/021; G09G 2354/00; G09G 2310/0286; G09G 2310/027
See application file for complete search history.

(56) References Cited

U.S. PATENT DOCUMENTS

| | | | |
|---|---|---|---|
| 2007/0063950 A1* | 3/2007 | Shin | G11C 19/184 345/92 |
| 2009/0122951 A1* | 5/2009 | Tobita | G11C 19/28 377/68 |
| 2010/0321372 A1* | 12/2010 | Iwamoto | G09G 3/3677 345/212 |
| 2015/0379912 A1* | 12/2015 | Wen | G11C 19/28 345/92 |
| 2016/0293092 A1* | 10/2016 | Li | G09G 3/2092 |
| 2016/0300623 A1* | 10/2016 | Yang | G11C 19/28 |
| 2016/0322115 A1* | 11/2016 | Xu | G11C 19/28 |
| 2017/0061913 A1* | 3/2017 | Wang | G11C 19/184 |
| 2017/0092172 A1* | 3/2017 | Wang | G11C 19/00 |
| 2017/0092212 A1* | 3/2017 | Wang | G11C 19/28 |
| 2017/0162152 A1* | 6/2017 | Zhao | G09G 3/3696 |
| 2017/0162153 A1* | 6/2017 | Zhao | G09G 3/3677 |
| 2017/0169780 A1* | 6/2017 | Zhao | G09G 3/3677 |
| 2017/0178582 A1* | 6/2017 | Li | G09G 3/3659 |
| 2017/0193887 A1* | 7/2017 | Wang | G11C 19/184 |
| 2017/0200418 A1* | 7/2017 | Zhang | G11C 19/28 |
| 2018/0061346 A1* | 3/2018 | Zhao | G09G 3/3677 |

FOREIGN PATENT DOCUMENTS

| | | |
|---|---|---|
| CN | 107633834 A | 1/2018 |
| CN | 207302594 U | 5/2018 |

OTHER PUBLICATIONS

International Search Report for PCT/CN2018/098168 dated Nov. 8, 2018.
Office Action for corresponding Chinese Application 201711056832.5 dated Nov. 14, 2019.

* cited by examiner

SHIFT REGISTER ELEMENT, METHOD FOR DRIVING THE SAME, GATE DRIVER CIRCUIT, AND DISPLAY DEVICE

CROSS-REFERENCES TO RELATED APPLICATIONS

This application is a US National Stage of International Application No. PCT/CN2018/098168, filed Aug. 1, 2018, which claims priority to Chinese Patent Application No. 201711056832.5, filed with the Chinese Patent Office on Oct. 27, 2017, and entitled "Shift register element, Method for driving the same, Gate driver circuit, and Display device", which is hereby incorporated by reference in its entirety.

FIELD

This disclosure relates to the field of display technologies, and particularly to a shift register element, a method for driving the same, a gate driver circuit, and a display device.

BACKGROUND

In a thin film transistor display, the gate driver circuit provides gate driving signals to gates of respective Thin Film Transistors (TFTs) in a pixel area. The gate driver circuit can be formed on an array substrate of the liquid crystal display in an array process, i.e., in a Gate Driver on Array (GOA) process, and this integrated process can not only save a cost, but also provide a liquid crystal panel with an aesthetically pleasing design of two symmetric sides thereof, and dispense with a bonding area of gate Integrated Circuits (ICs), and a fan-out wiring space to thereby design the liquid crystal display with a narrow bezel; and this integrated process can also dispense with a bonding process in the direction of gate scan lines to thereby improve a production throughput and a good yield ratio.

SUMMARY

An embodiment of the disclosure provides a shift register element. The shift register element includes: a first input circuit configured to provide a first node with a signal of a first reference level terminal under the control of an input signal terminal; a second input circuit configured to provide the first node with a signal of a second reference level terminal under the control of a reset signal terminal; a first node control circuit configured to provide the first node with a signal of a fourth reference level terminal under the control of a third node; a second node control circuit configured to provide a second node with a signal of a first clock signal terminal under the control of the first reference level terminal, and to provide the second node with a signal of a second clock signal terminal under the control of the second reference level terminal; a third node control circuit configured to provide a third node with a signal of a third reference level terminal under the control of the second node, and to provide the third node with the signal of the fourth reference level terminal under the control of the first node; and N output circuits, wherein of the N output circuits, a n-th output circuit is configured to provide a n-th output terminal with a signal of a (n+2)-th clock signal terminal under the control of the first node, wherein n is any integer more than 0, and less than or equal to N, and N is an integer more than 1.

Optionally in the shift register element according to the embodiment of this disclosure, the first input circuit includes a first switch transistor, and the second input circuit includes a second switch transistor, wherein: the first switch transistor has a gate connected with the input signal terminal, a first electrode connected with the first reference level terminal, and a second electrode connected with the first node; and the second switch transistor has a gate connected with the reset signal terminal, a first electrode connected with the second reference level terminal, and a second electrode connected with the first node.

Optionally in the shift register element according to the embodiment of this disclosure, the second node control circuit includes a third switch transistor and a fourth switch transistor, wherein the third switch transistor has a gate connected with the first reference level terminal, a first electrode connected with the first clock signal terminal, and a second electrode connected with the second node; and the fourth switch transistor has a gate connected with the second reference level terminal, a first electrode connected with the second clock signal terminal, and a second electrode connected with the second node.

Optionally in the shift register element according to the embodiment of this disclosure, the third node control circuit includes a fifth switch transistor and a sixth switch transistor, wherein the fifth switch transistor has a gate connected with the second node, a first electrode connected with the third reference level terminal, and a second electrode connected with the third node; and the sixth switch transistor has a gate connected with the first node, a first electrode connected with the fourth reference level terminal, and a second electrode connected with the third node.

Optionally in the shift register element according to the embodiment of this disclosure, the first node control circuit includes a seventh switch transistor, wherein the seventh switch transistor has a gate connected with the third node, a first electrode connected with the fourth reference level terminal, and a second electrode connected with the first node.

Optionally in the shift register element according to the embodiment of this disclosure, the shift register element further includes a level holder circuit, wherein the level holder circuit includes a first capacitor and a second capacitor, wherein the first capacitor is connected between the first node and the fourth reference level terminal; and the second capacitor is connected between the third node and the fourth reference level terminal.

Optionally in the shift register element according to the embodiment of this disclosure, each output circuit includes an eighth switch transistor, wherein in the n-th output circuit, the eighth switch transistor has a gate connected with the first node, a first electrode connected with the (n+2)-th clock signal terminal, and a second electrode connected with the n-th output terminal.

Optionally in the shift register element according to the embodiment of this disclosure, each output circuit further includes a ninth switch transistor, wherein: the gate of the eighth switch transistor is connected with the first node through the ninth switch transistor, and a gate of the ninth switch transistor is connected with the third reference level terminal.

Optionally in the shift register element according to the embodiment of this disclosure, the shift register element further includes output reset circuits corresponding one-to-one to the output terminals, wherein: the output reset circuit corresponding to the n-th output terminal is configured to provide the n-th output terminal with the signal of the fourth reference level terminal under the control of the third node.

Optionally in the shift register element according to the embodiment of this disclosure, the output reset circuit includes a tenth switch transistor, wherein: the tenth switch transistor has a gate connected with the third node, and a first electrode connected with the fourth reference level terminal; and in the output reset circuit corresponding to the n-th output terminal, the tenth switch transistor has a second electrode connected with the n-th output terminal.

Optionally in the shift register element according to the embodiment of this disclosure, the shift register element further includes a discharging circuit, wherein: the discharging circuit is configured to provide the third node with the signal of the fourth reference level terminal under the control of an Enable control terminal.

Optionally in the shift register element according to the embodiment of this disclosure, the discharging circuit includes an eleventh switch transistor, wherein: the eleventh switch transistor has a gate connected with the Enable control terminal, a first electrode connected with the fourth reference level terminal, and a second electrode connected with the third node.

Correspondingly an embodiment of this disclosure further provides a method for driving the shift register element above. The method includes: in an input period, the first input circuit provides the first node with the signal of the first reference level terminal under the control of the input signal terminal, and the third node control circuit provides the third node with the signal of the fourth reference level terminal under the control of the first node; in an output period, the n-th output circuit provides the n-th output terminal with the signal of the (n+2)-th clock signal terminal under the control of the first node; and in a reset period, the second input circuit provides the first node with the signal of the second reference level terminal under the control of the reset signal terminal; the second node control circuit provides the second node with the signal of the first clock signal terminal under the control of the first reference level terminal, or provides the second node with the signal of the second clock signal terminal under the control of the second reference level terminal; and the third node control circuit provides the third node with the signal of the third reference level terminal under the control of the second node, and the first node control circuit provides the first node with the signal of the fourth reference level terminal under the control of the third node.

Correspondingly an embodiment of this disclosure further provides a gate driver circuit including at least a cascading circuit. The cascading circuit includes a plurality of cascaded shift register elements according to any one of the embodiments above of this disclosure. In the cascading circuit, the N-th output terminal of each of the other shift register elements than the last shift register element is connected with the input signal terminal of the succeeding shift register element; and the first output terminal of each of the other shift register elements than the first shift register element is connected with the reset signal terminal of the preceding shift register element.

Optionally in the gate driver circuit according to the embodiment of this disclosure, the gate driver circuit includes two cascading circuits, and each shift register elements includes two output circuits, wherein: in the first cascading circuit, both the first clock signal terminal of an odd-numbered shift register element, and the third clock signal terminal of an even-numbered shift register element are connected with the fifth clock signal line; both the second clock signal terminal of the odd-numbered shift register element, and the fourth clock signal terminal of the even-numbered shift register element are connected with the sixth clock signal line; both the third clock signal terminal of the odd-numbered shift register element, and the first clock signal terminal of the even-numbered shift register element are connected with the first clock signal line; and both the fourth clock signal terminal of the odd-numbered shift register element, and the second clock signal terminal of the even-numbered shift register element are connected with the second clock signal line; and in the second cascading circuit, both the first clock signal terminal of an odd-numbered shift register element, and the third clock signal terminal of an even-numbered shift register element are connected with the seventh clock signal line; both the second clock signal terminal of the odd-numbered shift register element, and the fourth clock signal terminal of the even-numbered shift register element are connected with the eighth clock signal line; both the third clock signal terminal of the odd-numbered shift register element, and the first clock signal terminal of the even-numbered shift register element are connected with the third clock signal line; and both the fourth clock signal terminal of the odd-numbered shift register element, and the second clock signal terminal of the even-numbered shift register element are connected with the fourth clock signal line; and wherein the clock signals output on the first clock signal line to the eighth clock signal line are different sequentially in phase by one eighth of a clock cycle.

Correspondingly an embodiment of this disclosure further provides a display device including the gate driver circuits according to the embodiment of this disclosure.

DETAILED DESCRIPTION

Figure 1:
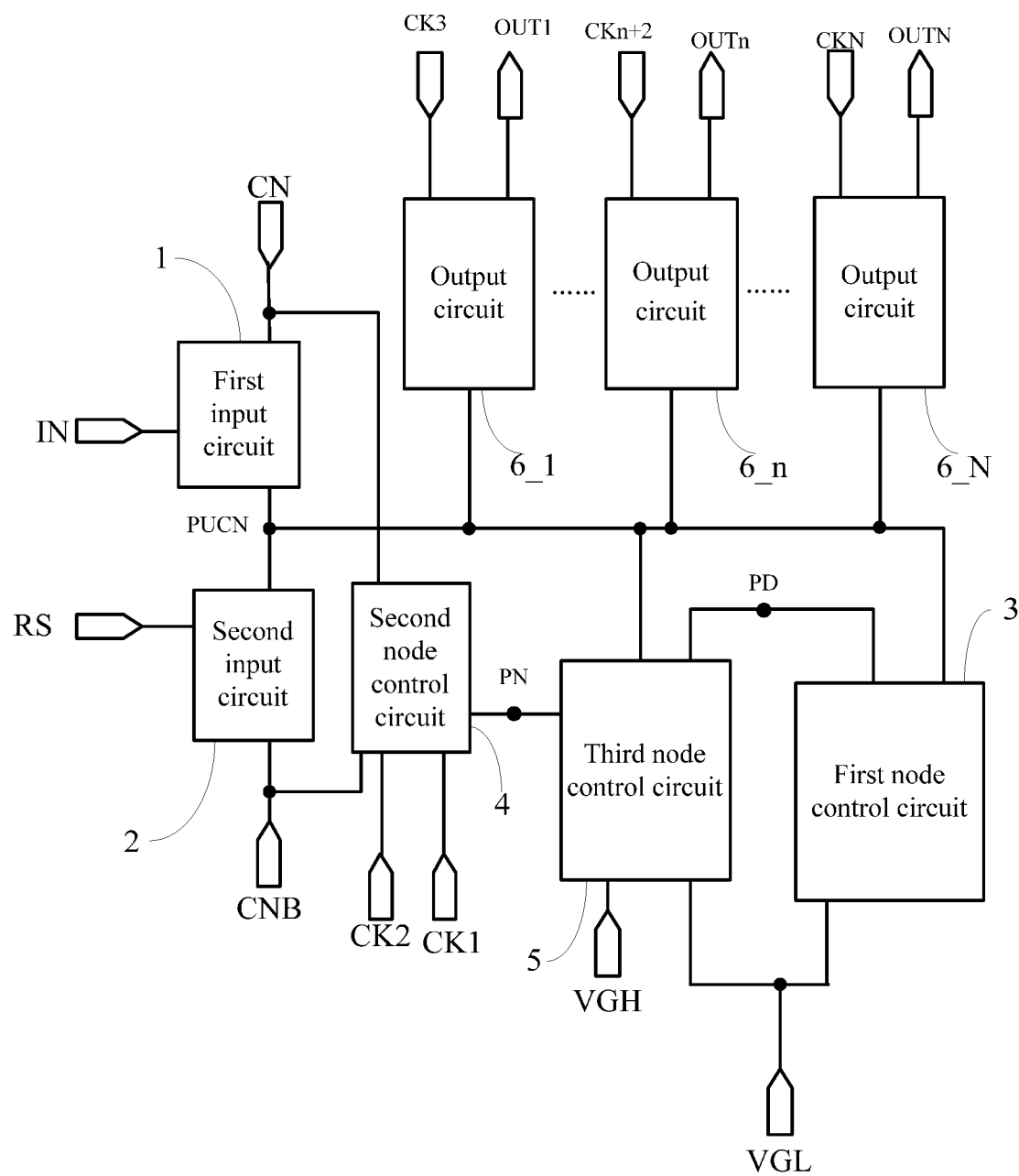
FIG. 1 is a first schematic structural diagram of a shift register element according to an embodiment of this disclosure.
Figure 2:
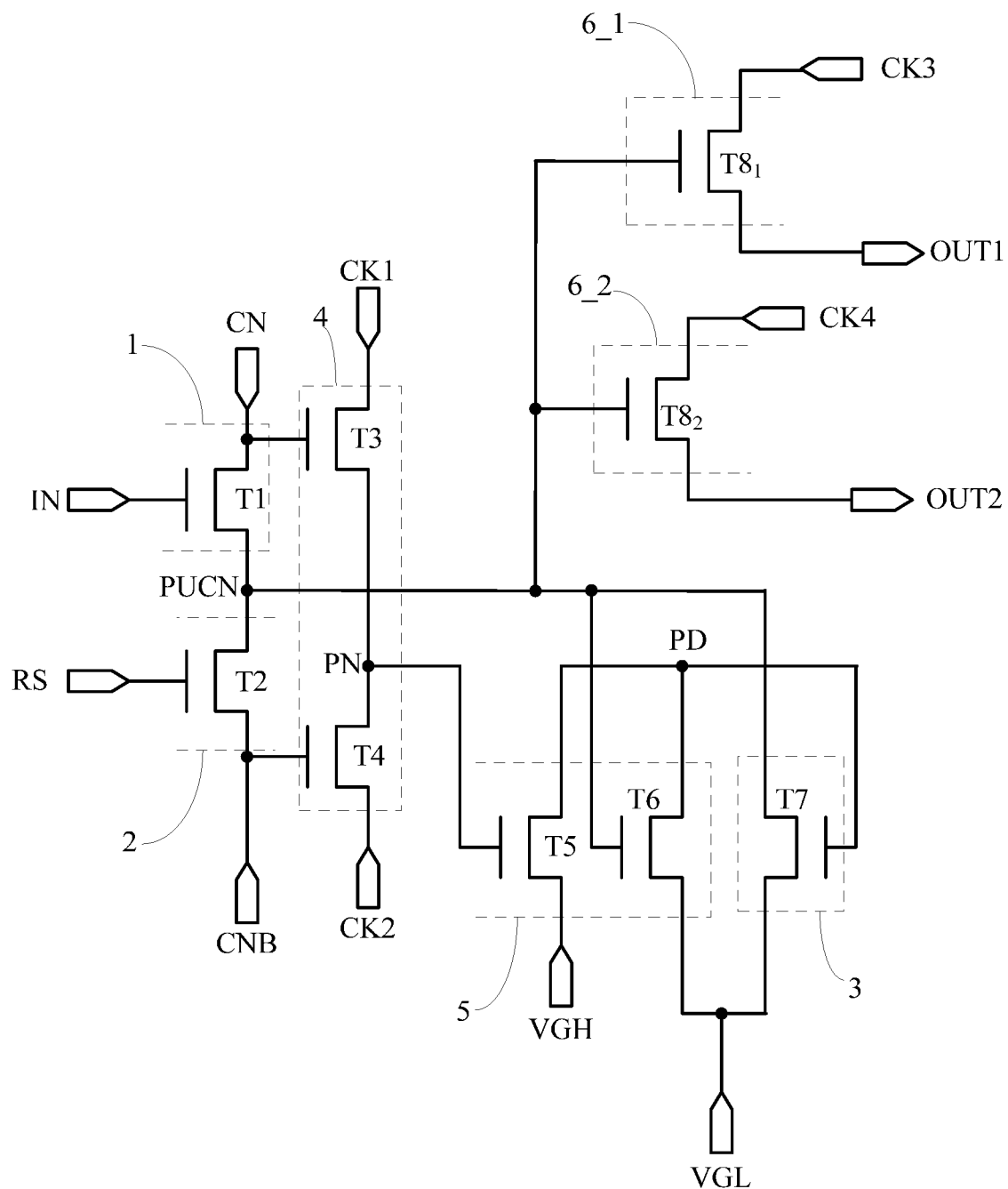
FIG. 2 is a second schematic structural diagram of the shift register element according to the embodiment of this disclosure.

In order to make the objects, technical solutions, and advantages of this disclosure more apparent, this disclosure will be described below in further details with reference to the drawings, and apparently the embodiments to be described are only a part but not all of the embodiments of this disclosure. Based upon the embodiments here of this disclosure, all the other embodiments which can occur to those ordinarily skilled in the art without any inventive effort shall fall into the scope of this disclosure.

The shapes and sizes of respective components in the drawings are not intended to reflect any real proportion, but only intended to illustrate this disclosure.

As illustrated in FIG. 1, a shift register element according to an embodiment of this disclosure includes a first input circuit 1, a second input circuit 2, a first node control circuit 3, a second node control circuit 4, a third node control circuit 5, and N output circuits 6_n, where N is an integer more than 1, and n=1, 2, 3, N. In FIG. 1, N=2, for example.

The first input circuit 1 is configured to provide a first node PUCN with a signal of a first reference level terminal CN under the control of an input signal terminal In.

The second input circuit 2 is configured to provide the first node PUCN with a signal of a second reference level terminal CNB under the control of a reset signal terminal RS.

The first node control circuit 3 is configured to provide the first node PUCN with a signal of a fourth reference level terminal VGL under the control of a third node PD.

The second node control circuit 4 is configured to provide a second node PN with a signal of a first clock signal terminal CK1 under the control of the first reference level terminal CN, and to provide the second node PN with a signal of a second clock signal terminal CK2 under the control of the second reference level terminal CNB.

The third node control circuit 5 is configured to provide a third node PD with a signal of a third reference level terminal VGH under the control of the second node PN, and to provide the third node PD with the signal of the fourth reference level terminal VGL under the control of the first node PUCN.

Of the N output circuits 6_1 to 6_N, the n-th output circuit 6_n is configured to provide the n-th output terminal with a signal of the (n+2)-th clock signal terminal CKn+2 under the control of the first node PUCN, where n is any integer more than 0, and less than or equal to N.

The shift register element according to the embodiment of this disclosure includes the first input circuit, the second input circuit, the first node control circuit, the second node control circuit, the third node control circuit, and the N output circuits, where N is an integer more than 1. The first input circuit is configured to control the first node according to the input signal terminal; the second input circuit is configured to control the first node according to the reset signal terminal; the first node control circuit is configured to control the first node according to the third node; and the second node control circuit is configured to control the second node according to the first clock signal terminal and the second clock signal terminal, so that the third node control circuit controls the third node according to the second node and the first node, and the N output circuits are configured respectively to control the corresponding output terminals according to the corresponding clock signal terminals under the control of the first node. In the shift register element according to the embodiment of this disclosure, a plurality of output terminals are controlled by a plurality of output circuits so that a shift register element can be connected with a plurality of gate lines, and when the shift register element is applied to a display panel, the number of shift register elements can be reduced to thereby facilitate a design with a narrow bezel.

In a specific implementation, when the shift register element according to the embodiment of this disclosure is applied to a display panel, each output circuit in the shift register element corresponds to one gate line in the display panel, so when there are more output circuits in the shift register element according to the embodiment of this disclosure, then the number of shift register elements to be arranged is smaller when they are applied to the display panel. However since the respective output circuits in the shift register element are controlled by the first node, when there are a larger number of output circuits in the shift register element, then the level of the first node needs to be held for a longer period of time, but the level of the first node typically drops after being held for a period of time, and when the level of the first node drops, then the output stability of the output terminals may be affected. Accordingly in the shift register element according to the embodiment of this disclosure, preferably two or three output circuits are arranged. Of course, alternatively more output circuits can be arranged, although the embodiment of this disclosure will not be limited thereto.

This disclosure will be described below in details in connection with a particular embodiment thereof. It shall be noted that this embodiment is intended to better explain this disclosure, but not to limit this disclosure thereto.

Optionally in the shift register element according to the embodiment of this disclosure, as illustrated in FIG. 2 to FIG. 6, the first input circuit 1 includes a first switch transistor T1.

The first switch transistor T1 has a gate connected with the input signal terminal IN, a first electrode connected with the first reference level terminal CN, and a second electrode connected with the first node PUCN.

Specifically when the first switch transistor is turned on under the control of the input signal terminal, it provides the first node with the signal of the first reference level terminal to control the voltage of the first node.

The specific structure of the first input circuit in the shift register element has been described above only by way of an example, and in an implementation, the specific structure of the first input circuit will not be limited to the structure above according to the embodiment of this disclosure, but may alternatively be another structure known to those skilled in the art, and the embodiment of this disclosure will not be limited thereto.

Optionally in the shift register element according to the embodiment of this disclosure, as illustrated in FIG. 2 to FIG. 6, the second input circuit 2 includes a second switch transistor T2.

The second switch transistor T2 has a gate connected with the reset signal terminal RS, a first electrode connected with the second reference level terminal CNB, and a second electrode connected with the first node PUCN.

Specifically when the second switch transistor is turned on under the control of the reset signal terminal, it provides the first node with the signal of the second reference level terminal to control the voltage of the first node.

The specific structure of the second input circuit in the shift register element has been described above only by way of an example, and in an implementation, the specific structure of the second input circuit will not be limited to the structure above according to the embodiment of this disclosure, but may alternatively be another structure known to those skilled in the art, and the embodiment of this disclosure will not be limited thereto.

Optionally in the shift register element according to the embodiment of this disclosure, as illustrated in FIG. 2 to FIG. 6, the second node control circuit 4 includes a third switch transistor T3 and a fourth switch transistor T4.

The third switch transistor T3 has a gate connected with the first reference level terminal CN, a first electrode connected with the first clock signal terminal CK1, and a second electrode connected with the second node PN.

The fourth switch transistor T4 has a gate connected with the second reference level terminal CNB, a first electrode connected with the second clock signal terminal CK2, and a second electrode connected with the second node PN.

Specifically when the third switch transistor is turned on under the control of the first reference level terminal, it provides the second node with the signal of the first clock signal terminal, or when the fourth switch transistor is turned on under the control of the second reference level terminal, it provides the second node with the signal of the second clock signal terminal, to control the voltage at the second node.

The specific structure of the second node control circuit in the shift register element has been described above only by way of an example, and in an implementation, the specific structure of the second node control circuit will not be limited to the structure above according to the embodiment of this disclosure, but may alternatively be another structure known to those skilled in the art, and the embodiment of this disclosure will not be limited thereto.

Optionally in the shift register element according to the embodiment of this disclosure, as illustrated in FIG. 2 to FIG. 6, the third node control circuit 5 includes a fifth switch transistor T5 and a sixth switch transistor T6.

The fifth switch transistor T5 has a gate connected with the second node PN, a first electrode connected with the third reference level terminal VGH, and a second electrode connected with the third node PD.

The sixth switch transistor T6 has a gate connected with the first node PUCN, a first electrode connected with the fourth reference level terminal VGL, and a second electrode connected with the third node PD.

Specifically when the fifth switch transistor is turned on under the control of the second node, it provides the third node with the signal of the third reference level terminal, or when the sixth switch transistor is turned on under the control of the first node, it provides the third node with the signal of the fourth reference level terminal, to control the voltage at the third node.

The specific structure of the third node control circuit in the shift register element has been described above only by way of an example, and in an implementation, the specific structure of the third node control circuit will not be limited to the structure above according to the embodiment of this disclosure, but may alternatively be another structure known to those skilled in the art, and the embodiment of this disclosure will not be limited thereto.

Optionally in the shift register element according to the embodiment of this disclosure, as illustrated in FIG. 2 to FIG. 6, the first node control circuit 3 includes a seventh switch transistor T7.

The seventh switch transistor T7 has a gate connected with the third node PD, a first electrode connected with the fourth reference level terminal VGL, and a second electrode connected with the first node PU.

Specifically when the seventh switch transistor is turned on under the control of the third node, it provides the first node with the signal of the fourth reference level terminal to control the voltage at the first node.

The specific structure of the first node control circuit in the shift register element has been described above only by way of an example, and in an implementation, the specific structure of the first node control circuit will not be limited to the structure above according to the embodiment of this disclosure, but may alternatively be another structure known to those skilled in the art, and the embodiment of this disclosure will not be limited thereto.

Figure 4:
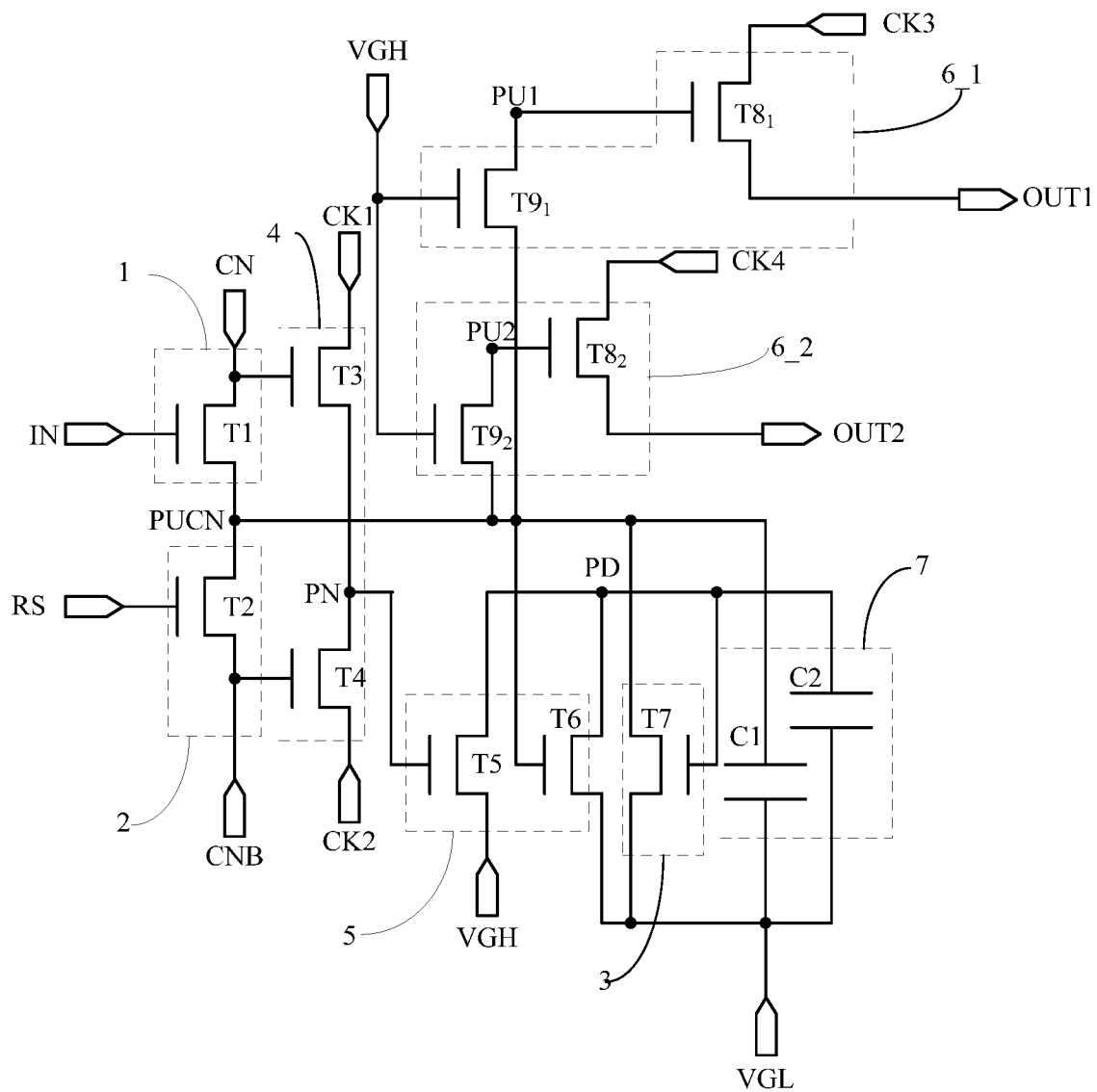
FIG. 4 is a fourth schematic structural diagram of the shift register element according to the embodiment of this disclosure.
Figure 5:
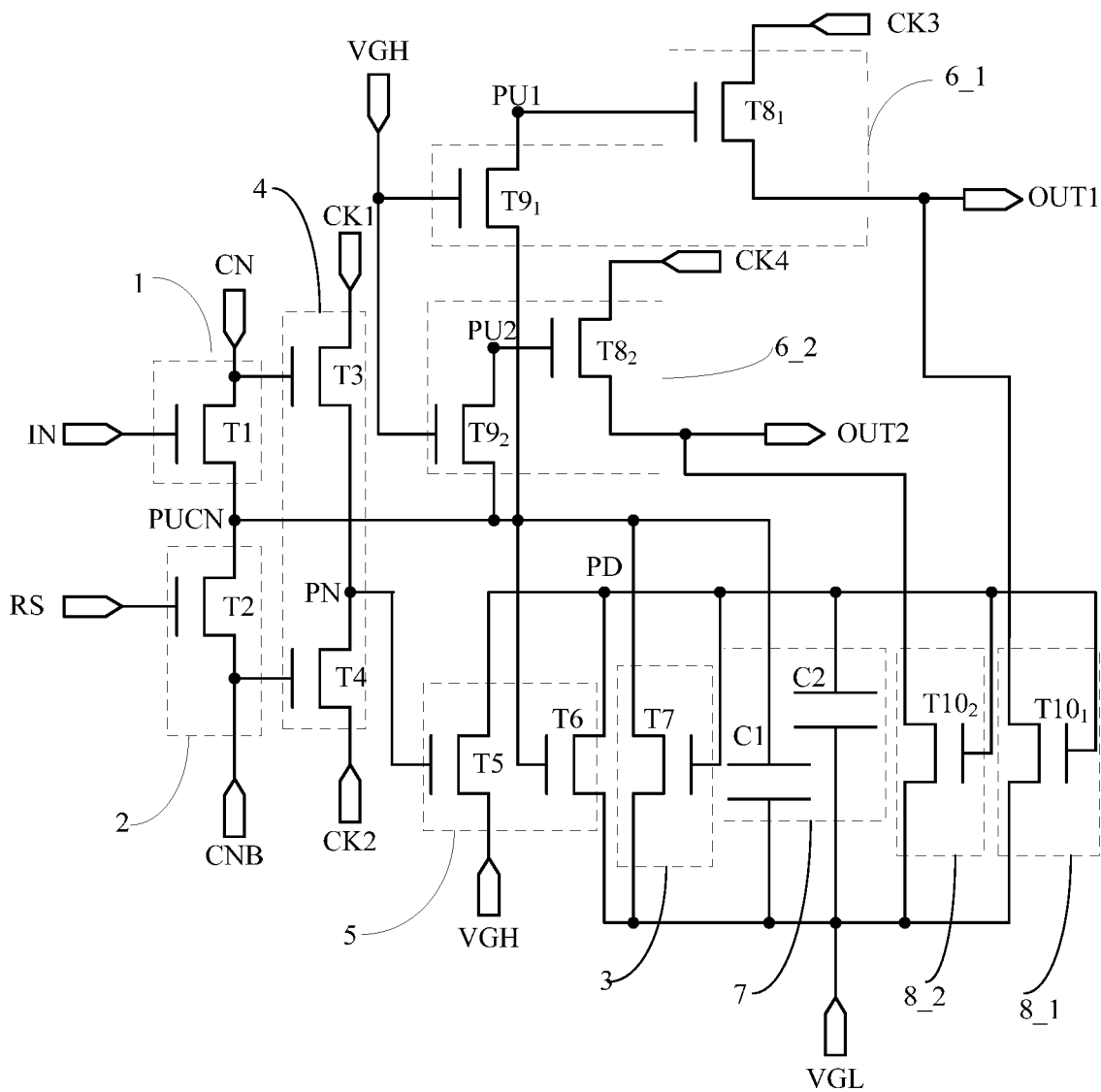
FIG. 5 is a fifth schematic structural diagram of the shift register element according to the embodiment of this disclosure.
Figure 6:
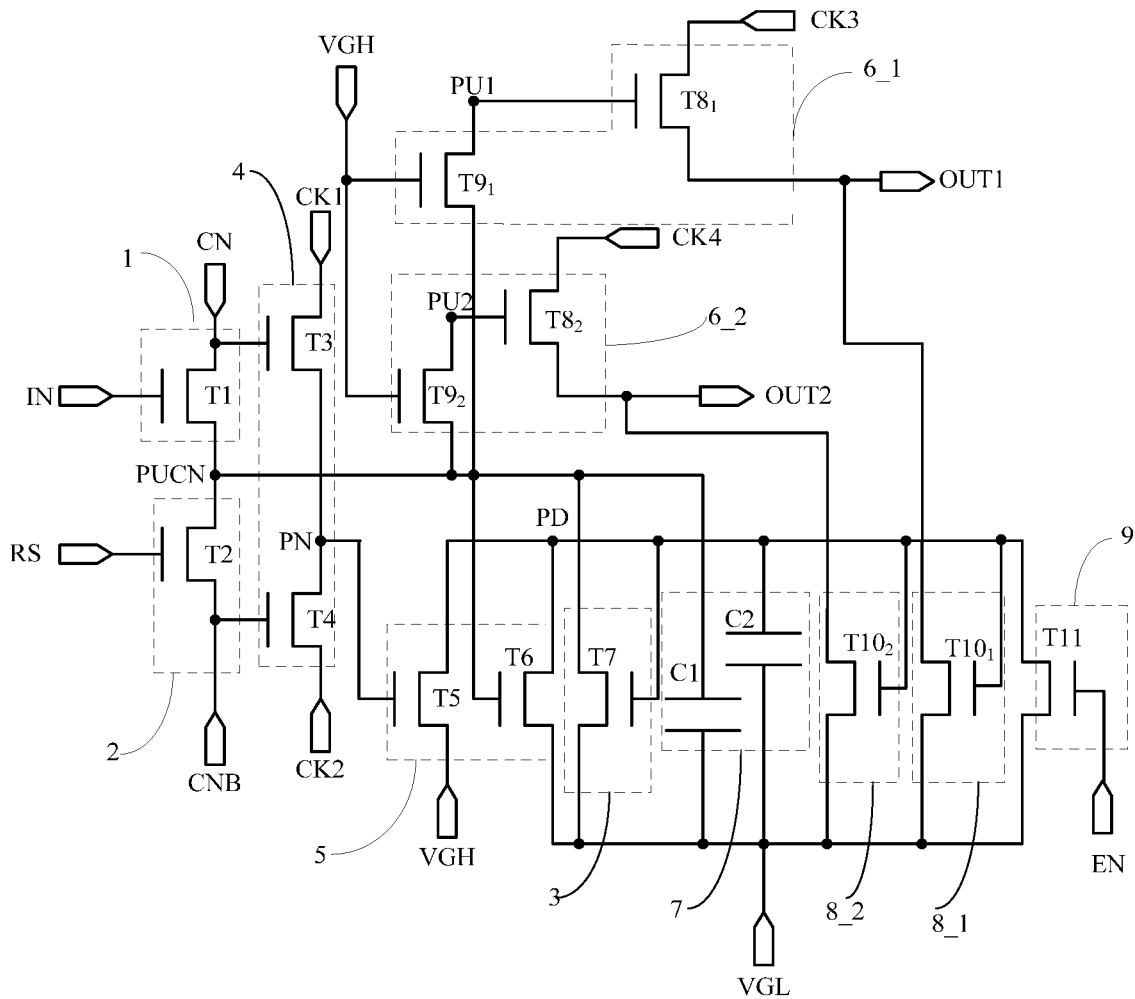
FIG. 6 is a sixth schematic structural diagram of the shift register element according to the embodiment of this disclosure.

Optionally in the shift register element according to the embodiment of this disclosure, as illustrated in FIG. 4 to FIG. 6, the shift register element further includes a level holder circuit 7, where the level holder circuit 7 includes a first capacitor C1 and a second capacitor C2.

The first capacitor C1 is connected between the first node PUCN and the fourth reference level terminal VGL.

The second capacitor C2 is connected between the third node PD and the fourth reference level terminal VGL.

Specifically while the first node is floating, the first capacitor is configured to hold the level at the first node to slow down dropping of the level at the first node. Alike while the second node is floating, the second capacitor is configured to hold the level at the second node to slow down dropping of the level at the second node.

Optionally in the shift register element according to the embodiment of this disclosure, as illustrated in FIG. 2 to FIG. 6, each output circuit 6_n includes an eighth switch transistor $T8_n$.

In the n-th output circuit 6_n, the eighth switch transistor $T8_n$ has a gate connected with the first node PUCN, a first electrode connected with the (n+2)-th clock signal terminal CKn+2, and a second electrode connected with the n-th output terminal OUTn.

For example, FIG. 2 to FIG. 6 illustrate the shift register element including two output circuits by way of an example. The first output circuit 6_1 includes an eighth switch transistor $T8_1$, where the eighth switch transistor $T8_1$ has a second electrode connected with the first output terminal OUT1; and the second output circuit 6_2 includes an eighth switch transistor $T8_2$, where the eighth switch transistor $T8_2$ has a second electrode connected with the second output terminal OUT2.

Specifically when the first node controls the eighth switch transistors in the respective output circuits to be turned on, the respective output terminals output the signals of the third clock signal terminal to the (N+2)-th clock signal terminal respectively, so the signals can be output at the output terminals row by row by setting the timing of the clock signals of the third clock signal terminal to the (N+2)-th clock signal terminal.

Optionally in the shift register element according to the embodiment of this disclosure, as illustrated in FIG. 3 to FIG. 6, each output circuit 6_n further includes a ninth switch transistor $T9_n$.

The gate of the eighth switch transistor $T8_n$ is connected with the first node PUCN through the ninth switch transistor T9$_n$, and a gate of the ninth switch transistor T9$_n$ is connected with the third reference level terminal VGH.

Specifically the third reference level terminal controls the ninth switch transistor to be turned on, so that the gate of the eighth switch transistor is connected with the first node through the turned-on ninth switch transistor, and as compared with the eighth switch transistor with the gate thereof being connected directly with the first node, leakage current at the gate of the eighth switch transistor can be lowered to thereby hold the level at the gate of the eighth switch transistor.

The specific structures of the respective output circuits in the shift register element have been described above only by way of an example, and in an implementation, the specific structures of the respective output circuits will not be limited to the structure above according to the embodiment of this disclosure, but may alternatively be other structures known to those skilled in the art, and the embodiment of this disclosure will not be limited thereto.

Optionally in the shift register element according to the embodiment of this disclosure, as illustrated in FIG. 5 and FIG. 6, the shift register element further includes output reset circuits 8_$n$ corresponding to the respective output terminals OUTn.

The output reset circuit 8_$n$ corresponding to the n-th output terminal OUTn is configured to provide the n-th output terminal OUTn with the signal of the fourth reference level terminal VGL under the control of the third node PD.

Optionally in the shift register element according to the embodiment of this disclosure, as illustrated in FIG. 6, the output reset circuit 8_$n$ includes a tenth switch transistor T10$_n$.

The tenth switch transistor T10$_n$ has a gate connected with the third node PD, and a first electrode connected with the fourth reference level terminal VGL.

In the output reset circuit 8_$n$ corresponding to the n-th output terminal OUTn, the tenth switch transistor T10$_n$ has a second electrode connected with the n-th output terminal OUTn.

Specifically when the tenth switch transistor is turned on under the control of the third node, it provides the corresponding output terminal with the signal of the fourth reference level terminal to reset the corresponding output terminal, to thereby further improve the circuit stability of the shift register element.

The specific structures of the respective output reset circuits in the shift register element have been described above only by way of an example, and in an implementation, the specific structures of the respective output reset circuits will not be limited to the structure above according to the embodiment of this disclosure, but may alternatively be other structures known to those skilled in the art, and the embodiment of this disclosure will not be limited thereto.

Optionally in the shift register element according to the embodiment of this disclosure, as illustrated in FIG. 6, the shift register element further includes a discharging circuit 9.

The discharging circuit 9 is configured to provide the third node PD with the signal of the fourth reference level terminal VGL under the control of an Enable control terminal EN.

Optionally in the shift register element according to the embodiment of this disclosure, as illustrated in FIG. 6, the discharging circuit 9 includes an eleventh switch transistor T11.

The eleventh switch transistor T11 has a gate connected with the Enable control terminal EN, a first electrode connected with the fourth reference level terminal VGL, and a second electrode connected with the third node PD.

Specifically in the display panel, after one frame is scanned, the eleventh switch transistor is turned on under the control of the Enable control terminal to provide the third node with the signal of the fourth reference level terminal, to reset the corresponding output terminal, and thereby further improve the circuit stability of the shift register element.

The specific structure of the discharging circuit in the shift register element has been described above only by way of an example, and in an implementation, the specific structure of the discharging circuit will not be limited to the structure above according to the embodiment of this disclosure, but may alternatively be another structure known to those skilled in the art, and the embodiment of this disclosure will not be limited thereto.

Figure 7:
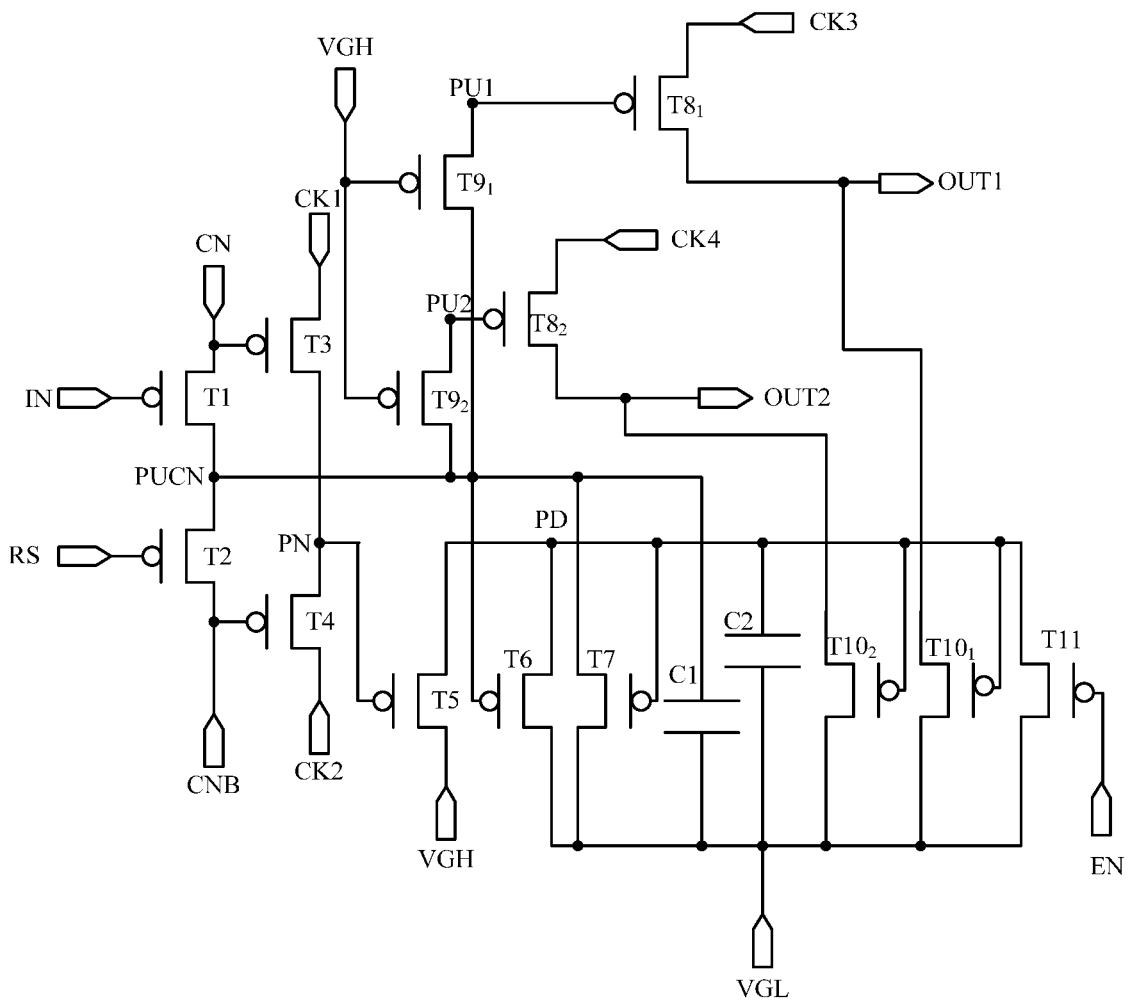
FIG. 7 is a seventh schematic structural diagram of the shift register element according to the embodiment of this disclosure.

Specifically in order to make a fabrication process uniform, in the shift register element according to the embodiment of this disclosure, as illustrated in FIG. 2 to FIG. 6, all the switch transistors are N-type transistors, or as illustrated in FIG. 7, all the switch transistors are P-type transistors.

Specifically in the shift register element according to the embodiment of this disclosure, the N-type transistors are turned on by a high-level signal, and turned off by a low-level signal; and the P-type transistors are turned on by a low-level signal, and turned off by a high-level signal.

Specifically in the shift register element according to the embodiment of this disclosure, the first electrodes of the transistors can be sources, and the second electrodes thereof can be drains, or the first electrodes of the transistors can be drains, and the second electrodes thereof can be sources, although the embodiment of this disclosure will not be limited thereto.

It shall be noted that in the shift register element according to the embodiment of this disclosure, when all the transistors are N-type transistors, the signal of the third reference level terminal is a high-level signal, and the signal of the fourth reference level terminal is a low-level signal; and when all the transistors are P-type transistors, the signal of the third reference level terminal is a low-level signal, and the signal of the fourth reference level terminal is a high-level signal.

Specifically in the shift register element according to the embodiment of this disclosure, any switch transistor can be arranged in a dual-gate structure from the perspective of lowering leakage current, although the embodiment of this disclosure will not be limited thereto.

Specifically in the shift register element according to the embodiment of this disclosure, the first input circuit and the second input circuit designed to be symmetric can have their functions replaced with each other, so the shift register element according to the embodiment of this disclosure can perform dual-direction scan. During forward scanning, the first input circuit is an input circuit, and the second input circuit is a reset circuit. During reverse scanning, the first input circuit is a reset circuit, and the second input circuit is an input circuit.

When all the switch transistors are N-type transistors, during forward scanning, the level at the first reference level terminal is a high level, and the level at the second reference level terminal is a low level. During reverse scanning, the level at the first reference level terminal is a low level, and the level at the second reference level terminal is a high level.

When all the switch transistors are P-type transistors, during forward scanning, the level at the first reference level terminal is a low level, and the level at the second reference level terminal is a high level. During reverse scanning, the level at the first reference level terminal is a high level, and the level at the second reference level terminal is a low level.

Based upon the same disclosure idea, an embodiment of this disclosure further provides a gate driver circuit, and since the gate driver circuit addresses the problem under a similar principle to the shift register element above, reference can be made to the implementation of the shift register element above for an implementation of the gate driver circuit, so a repeated description thereof will be omitted here.

Specifically the gate driver circuit according to the embodiment of this disclosure includes at least a cascading circuit including a plurality of cascaded shift register elements.

In the cascading circuit, the N-th output terminal of each of the other shift register elements than the last shift register element is connected with the input signal terminal of the succeeding shift register element.

The first output terminal of each of the other shift register elements than the first shift register element is connected with the reset signal terminal of the preceding shift register element.

Specifically the gate driver circuit is configured to provide scan lines on a display panel with scan signals, and since there are a large number of scan lines on the display panel, there are also a large number of shift register elements corresponding to the scan lines, so in order to reduce the width of a bezel of the display panel, typically two cascading circuits are designed to be arranged in the gate driver circuit, where one of the cascading circuits is arranged on the left side bezel of the display panel, and the other cascading circuit is arranged on the right side bezel of the display panel.

An example in which a shift register element includes two output circuits, i.e., two output terminals, will be described below, but the same principle will be extended to a shift register element including more output circuits, although the embodiment of this disclosure will not be limited thereto.

Figure 8:
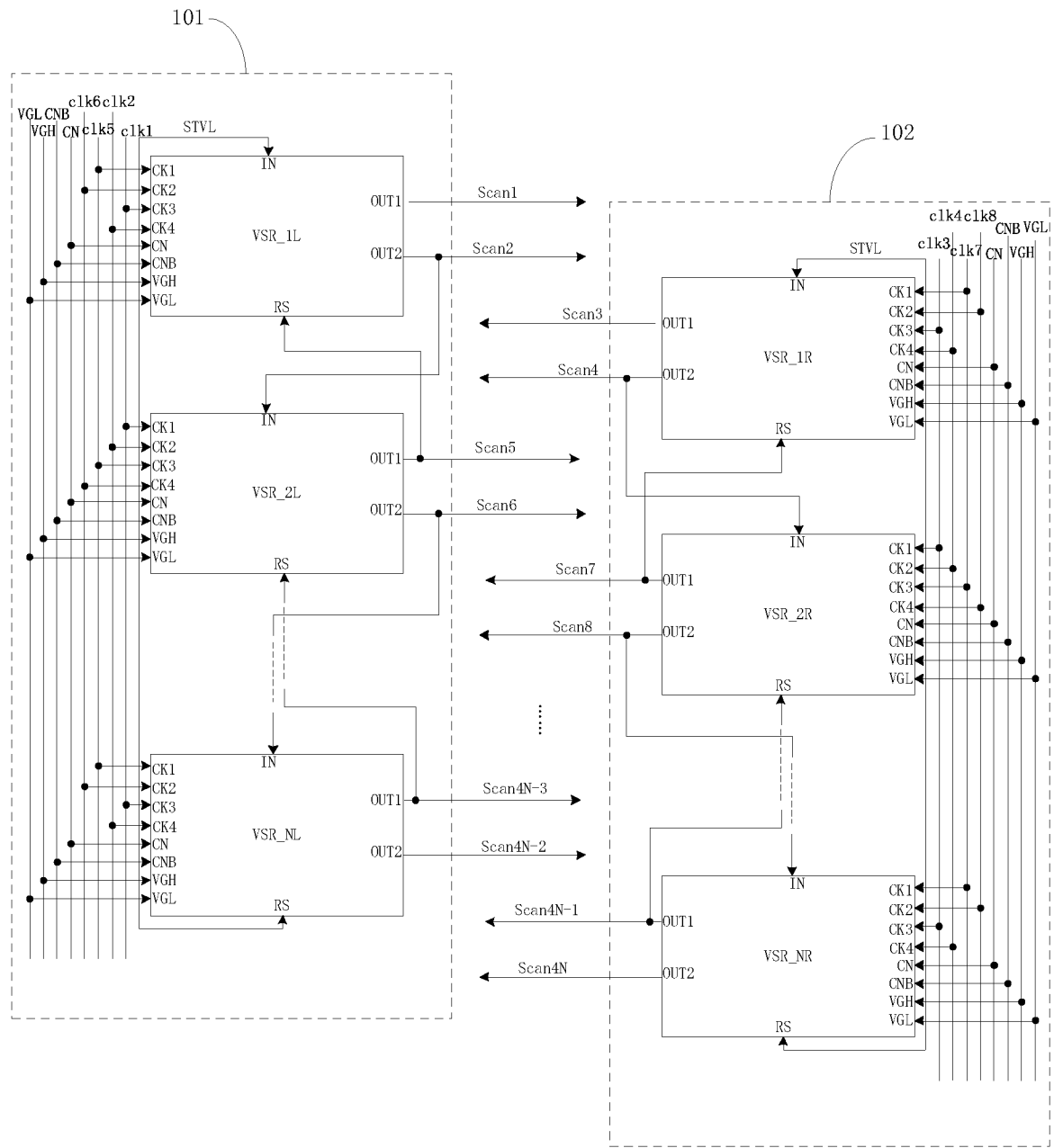
FIG. 8 is a first schematic structural diagram of gate driver circuits according to an embodiment of this disclosure.
Figure 9A:
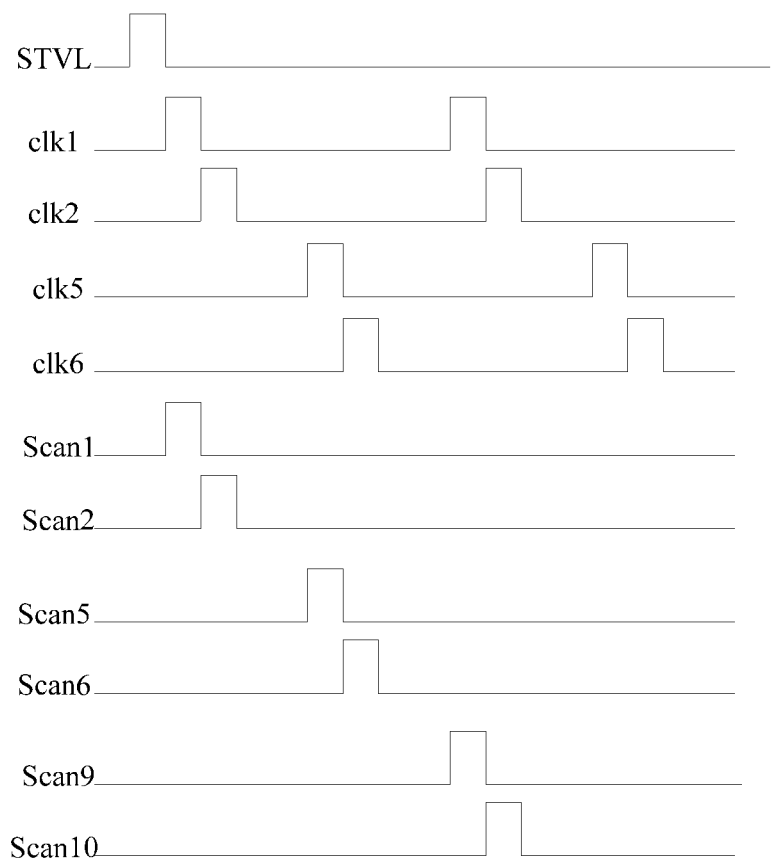
FIG. 9a is a timing diagram corresponding to a first gate driver circuit as illustrated in FIG. 8.
Figure 9B:
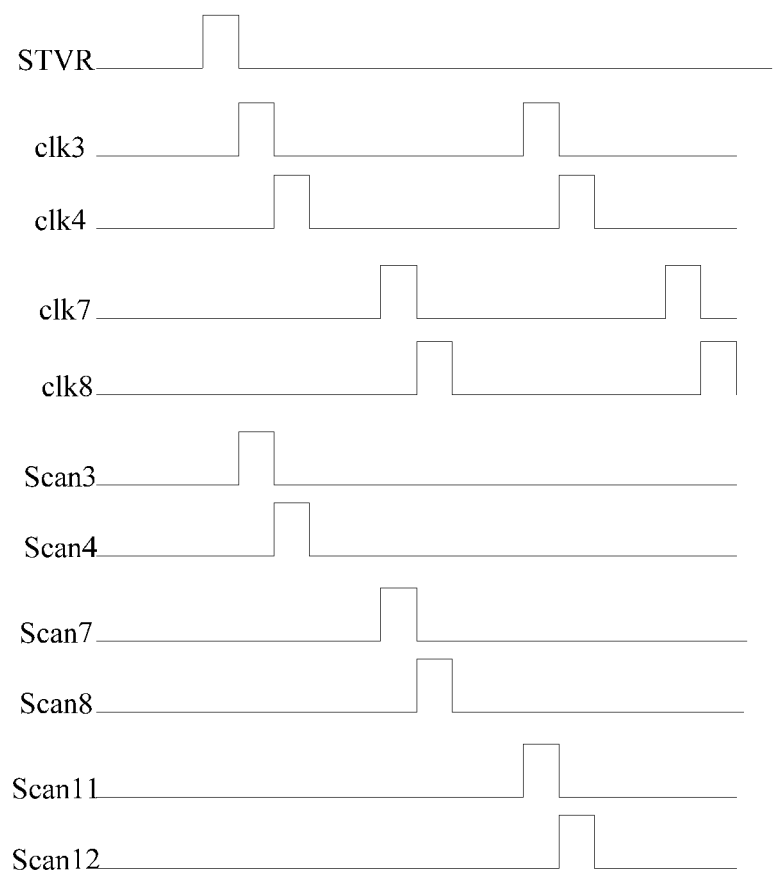
FIG. 9b is a timing diagram corresponding to a second gate driver circuit as illustrated in FIG. 8.
Figure 10:
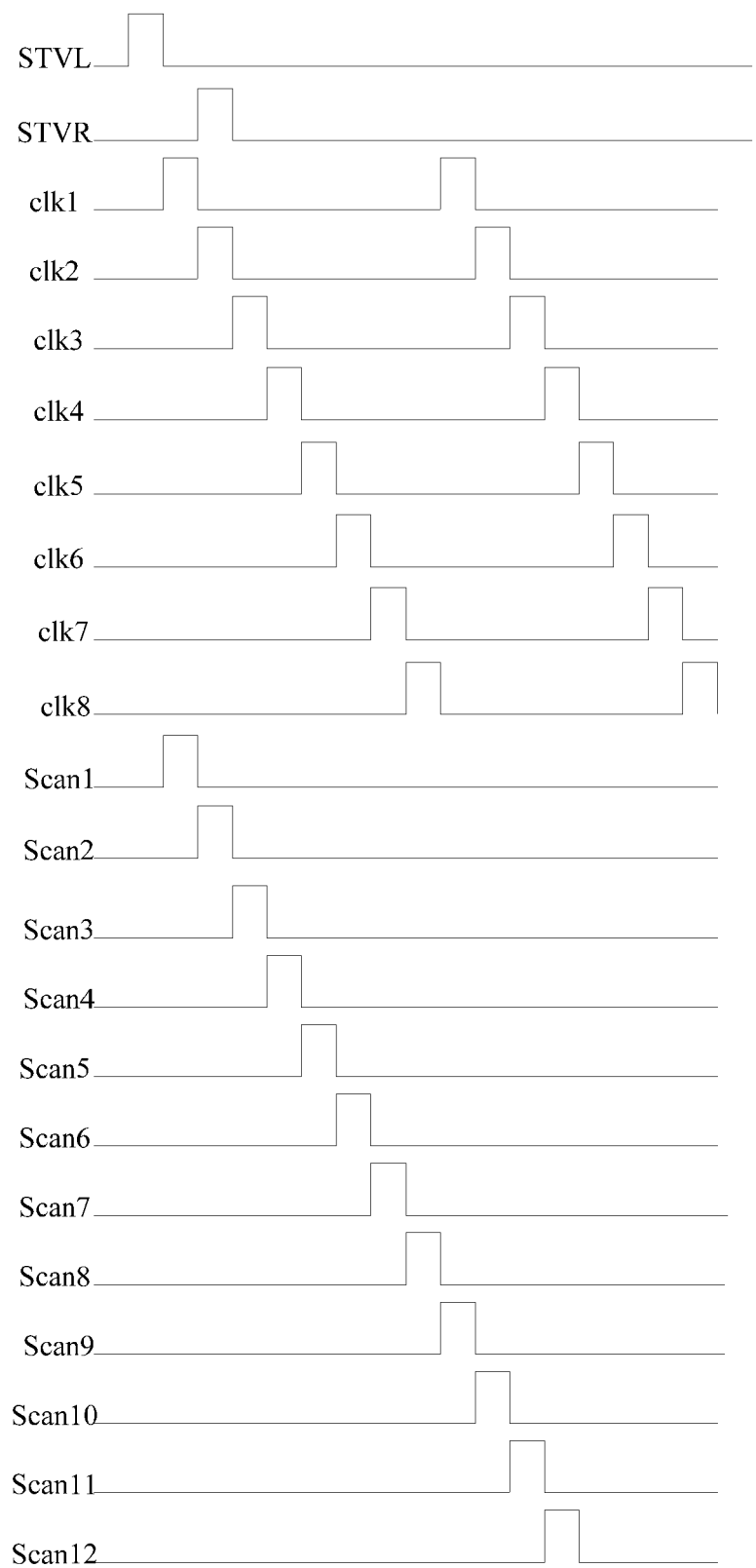
FIG. 10 is a timing diagram corresponding to the two gate driver circuits as illustrated in FIG. 8 as a whole.

Specifically as illustrated in FIG. 8, a first cascading circuit 101 and a second cascading circuit 102 are arranged respectively on two sides of a display panel, and in each cascading circuit, each shift register element is connected with two scan lines Scan so that two signals can be output consecutively, where the first cascading circuit 101 includes shift register elements VSR_1L, VSR 2L, VSR_NL, where both the first clock signal terminal(s) CK1 of the odd-numbered shift register element(s), and the third clock signal terminal(s) CK3 of the even-numbered shift register element(s) are connected with the fifth clock signal line clk5; both the second clock signal terminal(s) CK2 of the odd-numbered shift register element(s), and the fourth clock signal terminal(s) CK4 of the even-numbered shift register element(s) are connected with the sixth clock signal line clk6; both the third clock signal terminal(s) CK3 of the odd-numbered shift register element(s), and the first clock signal terminal(s) CK1 of the even-numbered shift register element(s) are connected with the first clock signal line clk1; and both the fourth clock signal terminal(s) CK4 of the odd-numbered shift register element(s), and the second clock signal terminal(s) CK2 of the even-numbered shift register element(s) are connected with the second clock signal line clk2; and FIG. 9a illustrates a timing diagram of forward scanning corresponding to the first cascading circuit. In the second cascading circuit 102, both the first clock signal terminal(s) CK1 of the odd-numbered shift register element(s), and the third clock signal terminal(s) CK3 of the even-numbered shift register element(s) are connected with the seventh clock signal line clk7; both the second clock signal terminal(s) CK2 of the odd-numbered shift register element(s), and the fourth clock signal terminal(s) CK4 of the even-numbered shift register element(s) are connected with the eighth clock signal line clk8; both the third clock signal terminal(s) CK3 of the odd-numbered shift register element(s), and the first clock signal terminal(s) CK1 of the even-numbered shift register element(s) are connected with the third clock signal line clk3; and both the fourth clock signal terminal(s) CK4 of the odd-numbered shift register element(s), and the second clock signal terminal(s) CK2 of the even-numbered shift register element are connected with the fourth clock signal line clk4; and FIG. 9b illustrates a timing diagram of forward scanning corresponding to the second cascading circuit. Here the clock signals output on the first clock signal line clk1 to the eighth clock signal line clk8 are different sequentially in phase by one eighth of a clock cycle. FIG. 10 illustrates a timing diagram of forward scanning corresponding to the gate driver circuit as a whole.

Specifically as illustrated in FIG. 8, in the cascading circuits, the input signal terminal IN of the k-th shift register element is connected with the second output terminal OUT2 of the (k−1)-th shift register element, the reset signal terminal RS of the k-th shift register element is connected with the first output terminal OUT of the (k+1)-th shift register element, and the input signal terminal IN of the first shift register element and the reset signal terminal RS of the last shift register element are connected with the signal line STVL or STVR.

Figure 11:
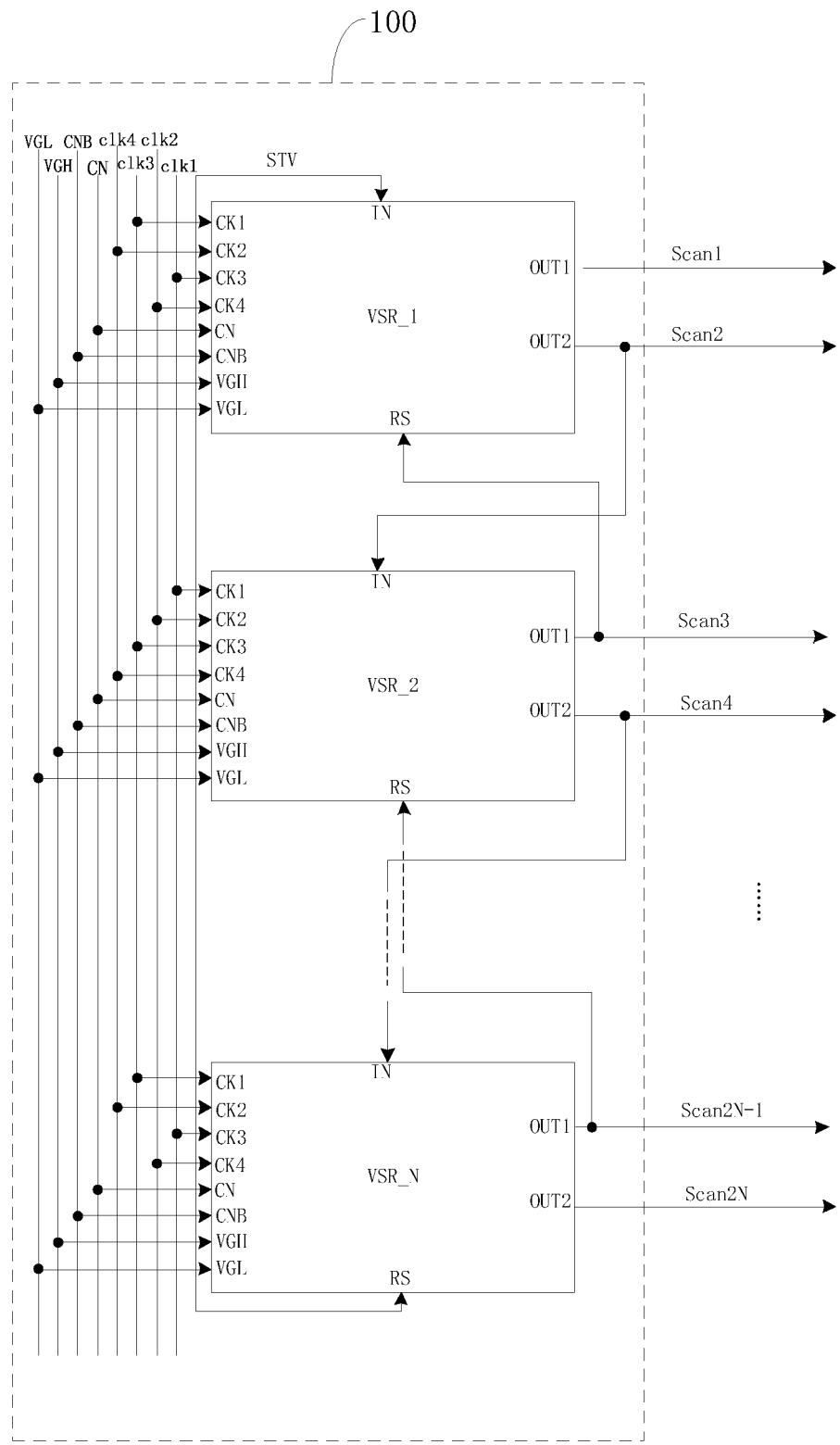
FIG. 11 is a second schematic structural diagram of a gate driver circuit according to an embodiment of this disclosure.
Figure 12:
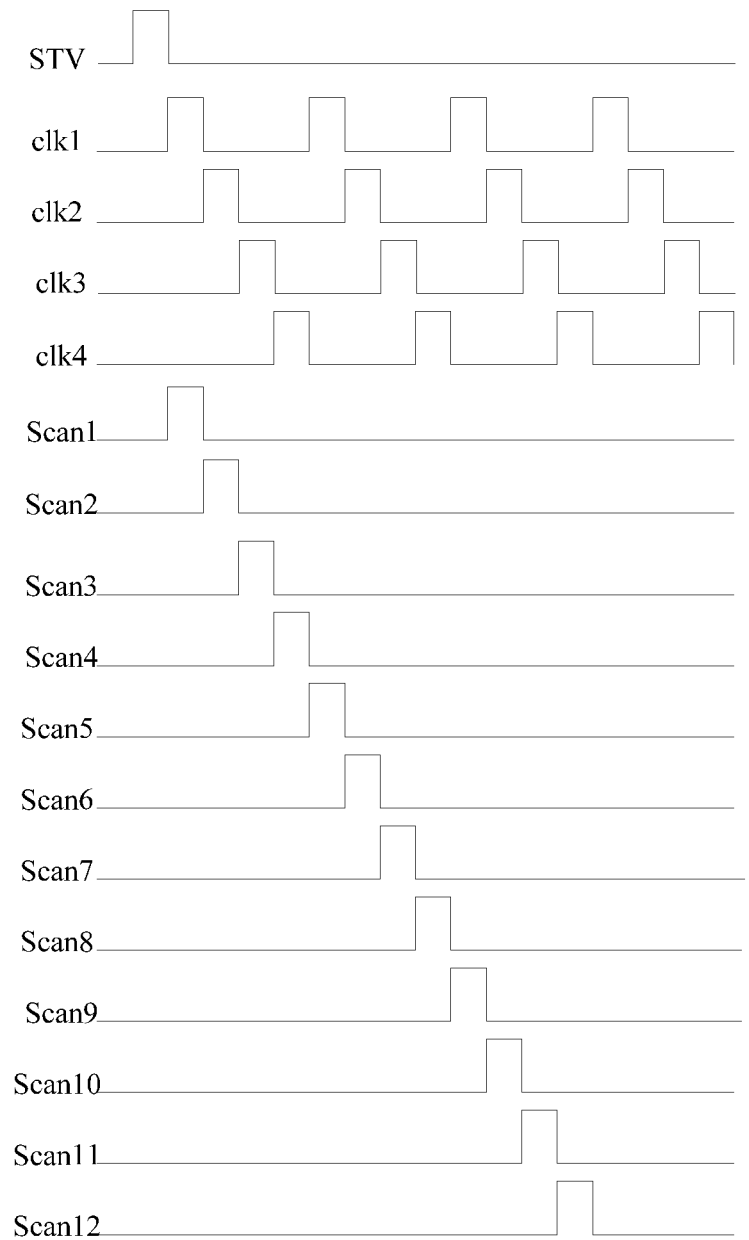
FIG. 12 is a timing diagram of the gate driver circuit as illustrated in FIG. 11.

Of course, in a specific implementation, the shift register elements corresponding to the respective scan lines in the display panel can alternatively be integrated on one side of the display panel, that is, a gate driver circuit is connected with all the scan lines of the display panel. As illustrated in FIG. 11, a gate driver circuit 100 includes one cascading circuit including shift register elements VSR_1, VSR_2, VSR_N connected with four clock signal lines clk1, clk2, clk3, clk4, where the input signal terminal IN of the k-th shift register element is connected with the second output terminal OUT2 of the (k−1)-th shift register element, the reset signal terminal RS of the k-th shift register element is connected with the first output terminal OUT of the (k+1)-th shift register element, and the input signal terminal of the first shift register element, and the reset signal terminal of the last shift register element are connected with the signal line STV; and FIG. 12 illustrates a timing diagram of forward scanning corresponding to the gate driver circuit.

An operating process of a gate driver circuit according to an embodiment of the invention will be described below in details for a shift register element thereof in connection with a circuit timing diagram, for example, of forward scanning. In the following description, 1 represents a high level, and 0 represents a low level. It shall be noted that 0 and 1 represent logic levels, and are only intended to better explain the specific operating process according to the embodiment of this disclosure, but not to suggest any specific voltage.

For example, the shift register element is applied to the gate driver circuit as illustrated in FIG. 8.

First Example

Figure 3:
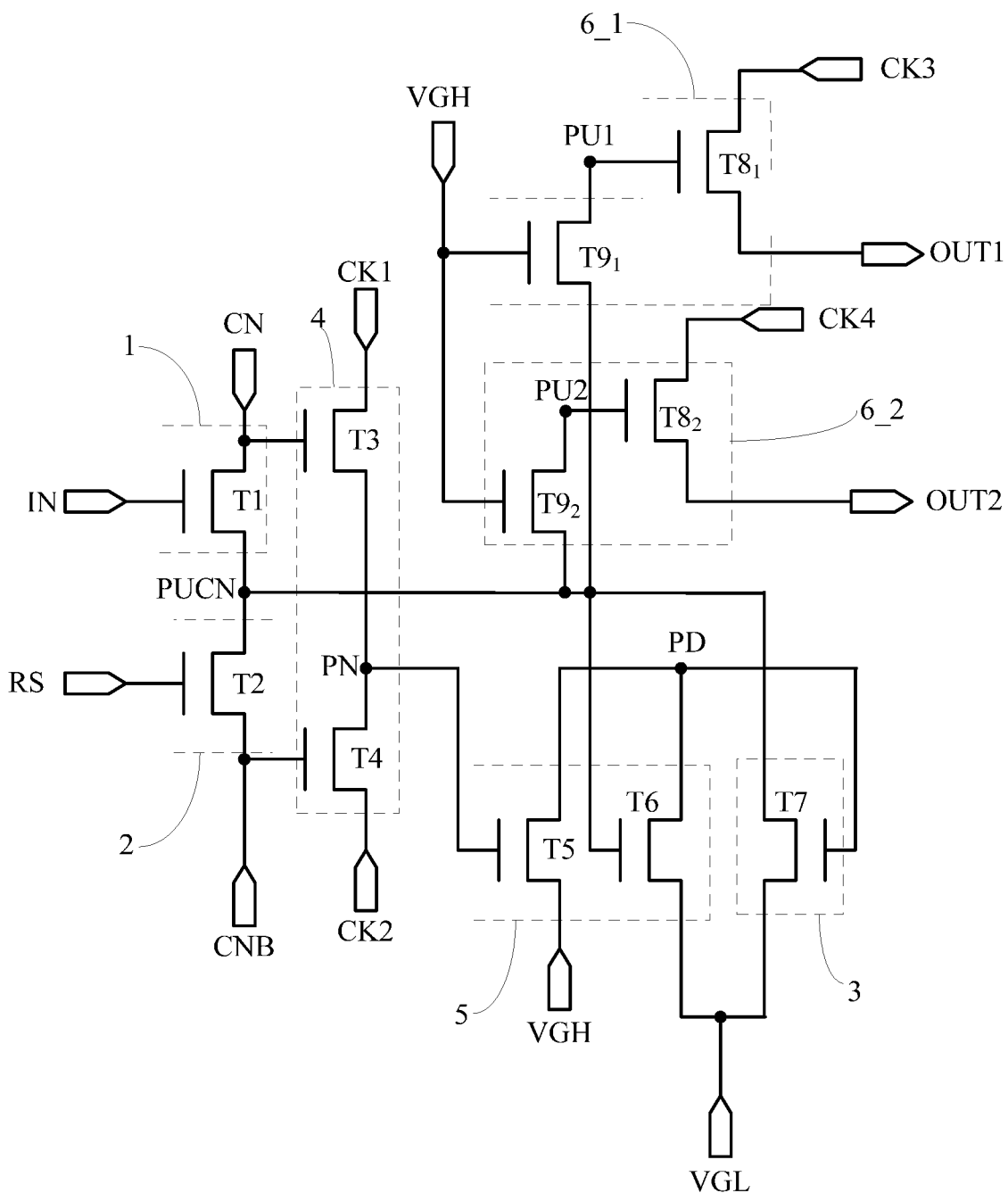
FIG. 3 is a third schematic structural diagram of the shift register element according to the embodiment of this disclosure.
Figure 13:
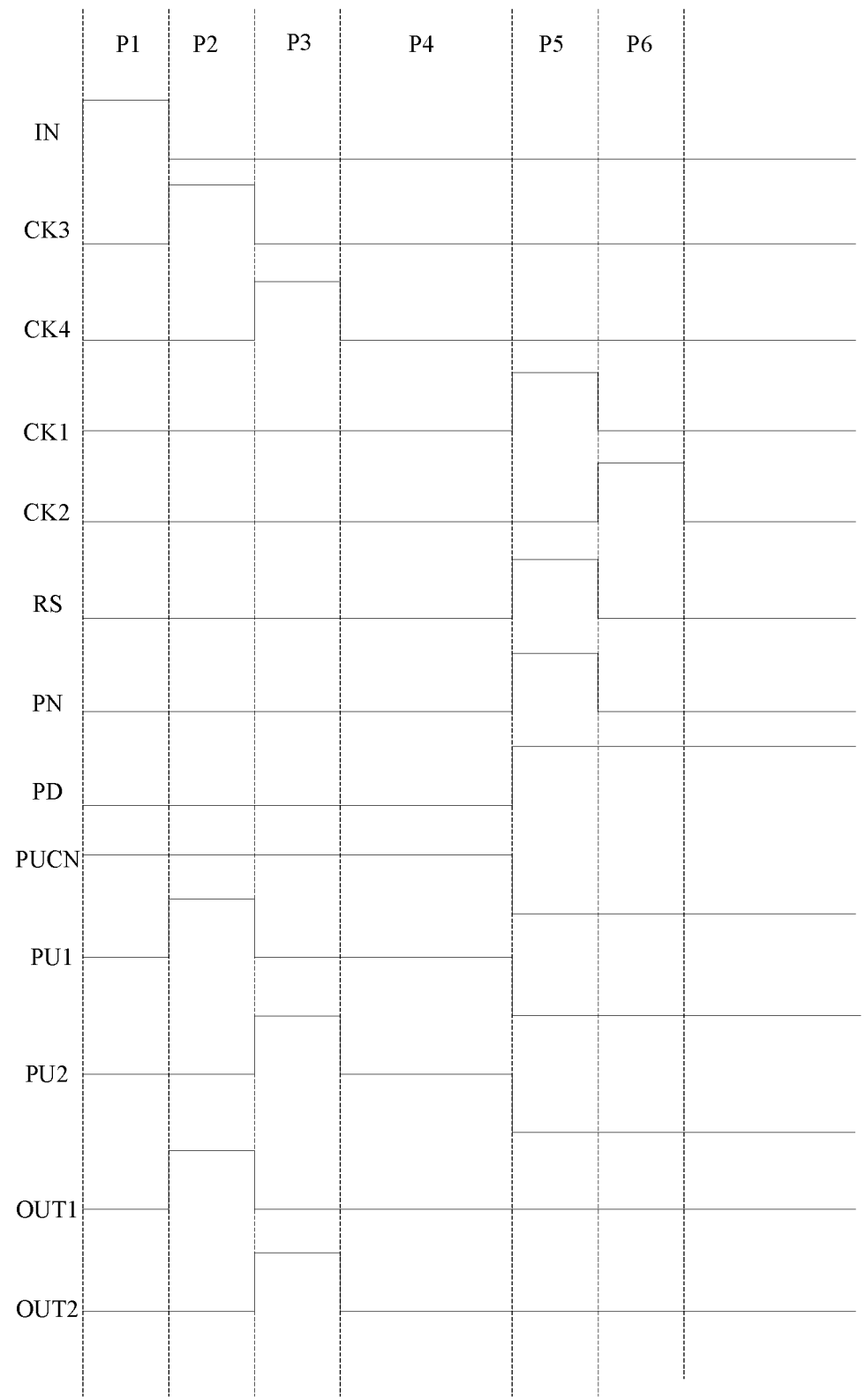
FIG. 13 is a first timing diagram corresponding to a shift register element according to an embodiment of this disclosure.

Taking the shift register element as illustrated in FIG. 3 as an example, CN=1, CNB=0, VGH=1, VGL=0, and FIG. 13 illustrates a corresponding timing diagram thereof.

In a period P1, IN=1, RS=0, CK1=0, CK2=0, CK3=0, CK4=0.

With IN=1, the first switch transistor T1 is turned on, the high-level signal of the first reference level terminal CN is transmitted to the first node PUCN through the turned-on first switch transistor T1, the level at the first node PUCN is a high level, and the sixth switch transistor T6 is turned on. With VGH=1, the ninth switch transistors $T9_1$ and $T9_2$ are turned on, the levels at the first control node PU1 and the second control node PU2 are a high level, the eighth switch transistors $T8_1$ and $T8_2$ are turned on, the low-level signal of the third clock signal terminal CK3 is transmitted to the first output terminal OUT1 through the turned-on eighth switch transistor $T8_1$, the level at the first output terminal OUT1 is a low level, the low-level signal of the fourth clock signal terminal CK4 is transmitted to the second output terminal OUT2 through the turned-on eighth switch transistor $T8_2$, the level at the second output terminal OUT2 is a low level, the low-level signal of the fourth reference level terminal VGL is transmitted to the third node PD through the turned-on sixth switch transistor T6, the level at the third node PD is a low level, and the seventh switch transistor T7 is turned off. With CN=1, the third switch transistor T3 is turned on, the low-level signal of the first clock signal terminal CK1 is transmitted to the second node PN through the turned-on third switch transistor T3, the level at the second node PN is a low level, and the fifth switch transistor T5 is turned off. With CNB=0, the fourth switch transistor T4 is turned off. With RS=0, the second switch transistor T2 is turned off.

In a period P2, IN=0, RS=0, CK1=0, CK2=0, CK3=1, CK4=0.

With IN=0, the first switch transistor T1 is turned off, and with RS=0, the second switch transistor T2 is turned off, so the first node is floating, and the level at the first node PUCN is held at a high level. The ninth switch transistors $T9_1$ and $T9_2$ are turned on, the levels at the first control node PU1 and the second control node PU2 are still a high level, the high-level signal of the third clock signal terminal CK3 is transmitted to the first output terminal OUT1 through the turned-on eighth switch transistor $T8_1$, and the level at the first output terminal OUT1 is changed to a high level. Due to bootstrapping of a coupling capacitor in the eighth switch transistor $T8_1$, the level at the first control node PU1 is further pulled up to thereby guarantee a stable output. As the level at the first control node PU1 is further pulled up, the gate-source voltage of the ninth switch transistor $T9_1$ is lower than the start-on voltage, and the ninth switch transistor $T9_1$ is turned off. The low-level signal of the fourth clock signal terminal CK4 is transmitted to the second output terminal OUT2 through the turned-on eighth switch transistor $T8_2$, the level at the second output terminal OUT2 is a low level, the low-level signal of the fourth reference level terminal VGL is transmitted to the third node PD through the turned-on sixth switch transistor T6, the level at the third node PD is a low level, and the seventh switch transistor T7 is turned off. With CN=1, the third switch transistor T3 is turned on, the low-level signal of the first clock signal terminal CK1 is transmitted to the second node PN through the turned-on third switch transistor T3, the level at the second node PN is a low level, and the fifth switch transistor T5 is turned off. With CNB=0, the fourth switch transistor T4 is turned off.

In a period P3, IN=0, RS=0, CK1=0, CK2=0, CK3=0, CK4=1.

With IN=0, the first switch transistor T1 is turned off, and with RS=0, the second switch transistor T2 is turned off, so the first node is floating, the level at the first node PUCN is held at a high level, and the sixth switch transistor T6 is turned on. The ninth switch transistors $T9_1$ and $T9_2$ are turned on, the levels at the first control node PU1 and the second control node PU2 are still a high level, the low-level signal of the third clock signal terminal CK3 is transmitted to the first output terminal OUT1 through the turned-on eighth switch transistor $T8_1$, and the level at the first output terminal OUT1 is changed to a low level. Due to bootstrapping of a coupling capacitor in the eighth switch transistor $T8_1$, the level at the first control node PU1 drops therewith, but is still held at a high level. The high-level signal of the fourth clock signal terminal CK4 is transmitted to the second output terminal OUT2 through the turned-on eighth switch transistor $T8_2$, and the level at the second output terminal OUT2 is changed to a high level. Due to bootstrapping of a coupling capacitor in the eighth switch transistor $T8_2$, the level at the second control node PU2 is further pulled up to thereby guarantee a stable output. As the level at the second control node PU2 is further pulled up, the gate-source voltage of the ninth switch transistor $T9_2$ is lower than the start-on voltage, and the ninth switch transistor $T9_2$ is turned off. The low-level signal of the fourth reference level terminal VGL is transmitted to the third node PD through the turned-on sixth switch transistor T6, the level at the third node PD is a low level, and the seventh switch transistor T7 is turned off. With CN=1, the third switch transistor T3 is turned on, the low-level signal of the first clock signal terminal CK1 is transmitted to the second node PN through the turned-on third switch transistor T3, the level at the second node PN is a low level, and the fifth switch transistor T5 is turned off. With CNB=0, the fourth switch transistor T4 is turned off.

In a period P4, IN=0, RS=0, CK1=0, CK2=0, CK3=0, CK4=0.

With IN=0, the first switch transistor T1 is turned off, and with RS=0, the second switch transistor T2 is turned off, so the first node is floating, and the level at the first node PUCN is held at a high level. The ninth switch transistors $T9_1$ and $T9_2$ are turned on, the levels at the first control node PU1 and the second control node PU2 are still a high level, the low-level signal of the third clock signal terminal CK3 is transmitted to the first output terminal OUT1 through the turned-on eighth switch transistor $T8_1$, the level at the first output terminal OUT1 is changed to a low level, the low-level signal of the fourth clock signal terminal CK4 is transmitted to the second output terminal OUT2 through the turned-on eighth switch transistor $T8_2$, and the level at the second output terminal OUT2 is changed to a low level. Due to bootstrapping of a coupling capacitor in the eighth switch transistor $T8_2$, the level at the second control node PU2 drops therewith, but is still held at a high level. The low-level signal of the fourth reference level terminal VGL is transmitted to the third node PD through the turned-on sixth switch transistor T6, the level at the third node PD is a low level, and the seventh switch transistor T7 is turned off. With CN=1, the third switch transistor T3 is turned on, the low-level signal of the first clock signal terminal CK1 is transmitted to the second node PN through the turned-on third switch transistor T3, the level at the second node PN is a low level, and the fifth switch transistor T5 is turned off. With CNB=0, the fourth switch transistor T4 is turned off.

In a period P5, IN=0, RS=1, CK1=1, CK2=0, CK3=0, CK4=0.

With IN=0, the first switch transistor T1 is turned off, and with RS=1, the second switch transistor T2 is turned on. The low-level signal of the second reference level terminal CNB is transmitted to the first node PUCN through the turned-on second switch transistor T2, the level at the first node PUCN is changed to a low level, the sixth switch transistor T6 is turned off, the levels at the first control node PU1 and the second control node PU2 are changed to a low level through the turned-on ninth switch transistors T9$_1$ and T9$_2$, and the eighth switch transistors T8$_1$ and T8$_2$ are turned off. With CN=1, the third switch transistor T3 is turned on, the high-level signal of the first clock signal terminal CK1 is transmitted to the second node PN through the turned-on third switch transistor T3, the level at the second node PN is changed to a high level, and the fifth switch transistor T5 is turned on. The high-level signal of the third reference level terminal VGH is transmitted to the third node PD through the turned-on fifth switch transistor T5, the level at the third node PD is changed to a high level, the seventh switch transistor T7 is turned on, and the low-level signal of the fourth reference level terminal VGL is transmitted to the first node PUCN through the turned-on seventh switch transistor T7, thus further ensuring the level at the first node PUCN to be a low level. With CNB=0, the fourth switch transistor T4 is turned off.

In a period P6, IN=0, RS=0, CK1=0, CK2=1, CK3=0, CK4=0.

With IN=0, the first switch transistor T1 is turned off, and with RS=0, the second switch transistor T2 is turned off, so the first node is floating, the level at the first node PUCN is held at a low level, and the sixth switch transistor T6 is turned off. Through turned-on the ninth switch transistors T9$_1$ and T9$_2$, the levels at the first control node PU1 and the second control node PU2 are still a low level, and the eighth switch transistors T8$_1$ and T8$_2$ are turned off. With CN=1, the third switch transistor T3 is turned on, the low-level signal of the first clock signal terminal CK1 is transmitted to the second node PN through the turned-on third switch transistor T3, the level at the second node PN is changed to a low level, and the fifth switch transistor T5 is turned off, so the third node is floating, the level at the third node PD is held at a high level, the seventh switch transistor T7 is turned on, and the low-level signal of the fourth reference level terminal VGL is transmitted to the first node PUCN through the turned-on seventh switch transistor T7, thus further ensuring the level at the first node PUCN to be a low level. With CNB=0, the fourth switch transistor T4 is turned off.

Thereafter until the next frame starts, the first node PUCN is held at a low level, the third node PD is held at a high level, and the second node PN is charged one time upon CK1=1 each time to charge the third node PD one time.

Second Example

Taking the shift register element as illustrated in FIG. 5 as an example, CN=1, CNB=0, VGH=1, VGL=0, and FIG. 13 illustrates a corresponding timing diagram thereof.

In a period P1, IN=1, RS=0, CK1=0, CK2=0, CK3=0, CK4=0.

The tenth switch transistors T10$_1$ and T10$_2$ are turned off, and operating states of the other switch transistors are the same as in the period P1 in the first example, so a repeated description thereof will be omitted here.

In a period P2, IN=0, RS=0, CK1=0, CK2=0, CK3=1, CK4=0.

The tenth switch transistors T10$_1$ and T10$_2$ are turned off, and operating states of the other switch transistors are the same as in the period P2 in the first example, so a repeated description thereof will be omitted here.

In a period P3, IN=0, RS=0, CK1=0, CK2=0, CK3=0, CK4=1.

The tenth switch transistors T10$_1$ and T10$_2$ are turned off, and operating states of the other switch transistors are the same as in the period P3 in the first example, so a repeated description thereof will be omitted here.

In a period P4, IN=0, RS=0, CK1=0, CK2=0, CK3=0, CK4=0.

The tenth switch transistors T10$_1$ and T10$_2$ are turned off, and operating states of the other switch transistors are the same as in the period P4 in the first example, so a repeated description thereof will be omitted here.

In a period P5, IN=0, RS=1, CK1=1, CK2=0, CK3=0, CK4=0.

The tenth switch transistors T10$_1$ and T10$_2$ are turned on, and the low-level signal of the fourth reference level terminal VGL is transmitted to the first output terminal OUT1 and the second output OUT2 respectively through the turned-on tenth switch transistors T10$_1$ and T10$_2$, to discharge the first output terminal OUT1 and the second output OUT2. Operating states of the other switch transistors are the same as in the period P5 in the first example, so a repeated description thereof will be omitted here.

In a period P6, IN=0, RS=0, CK1=0, CK2=1, CK3=0, CK4=0.

The tenth switch transistors T10$_1$ and T10$_2$ are turned on, and the low-level signal of the fourth reference level terminal VGL is transmitted to the first output terminal OUT1 and the second output OUT2 respectively through the turned-on tenth switch transistors T10$_1$ and T10$_2$, to discharge the first output terminal OUT1 and the second output OUT2. Operating states of the other switch transistors are the same as in the period P6 in the first example, so a repeated description thereof will be omitted here.

Thereafter until the next frame starts, the first node PUCN is held at a low level, the third node PD is held at a high level, the second node PN is charged one time upon CK1=1 each time to charge the third node PD one time, the tenth switch transistors T10$_1$ and T10$_2$ are turned on, and the low-level signal of the fourth reference level terminal VGL is transmitted to the first output terminal OUT1 and the second output OUT2 respectively through the turned-on tenth switch transistors T10$_1$ and T10$_2$, to discharge the first output terminal OUT1 and the second output OUT2. Operating states of the other switch transistors are the same as in the first example, so a repeated description thereof will be omitted here.

Third Example

Figure 14:
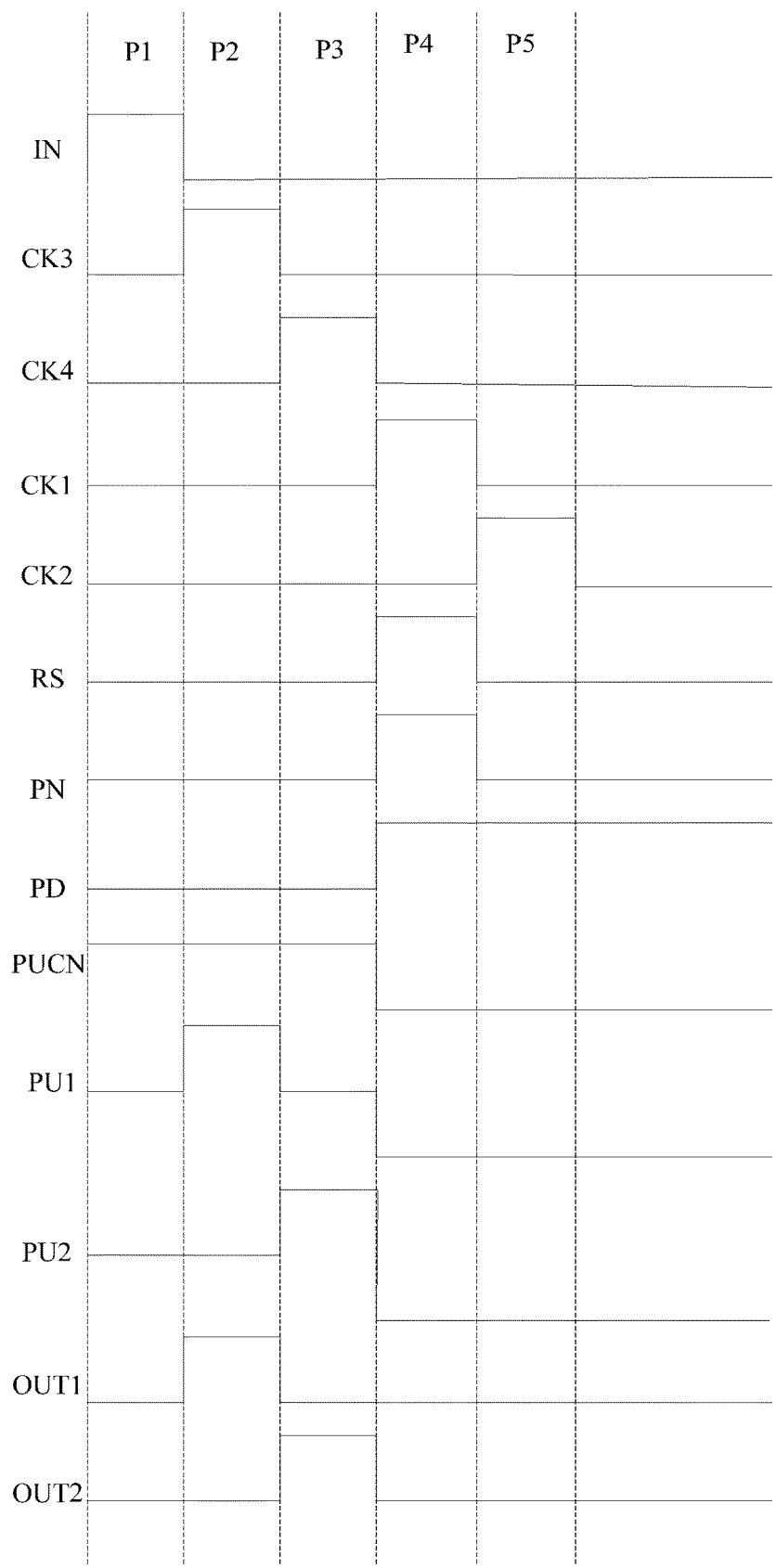
FIG. 14 is a second timing diagram corresponding to the shift register element according to the embodiment of this disclosure.

When the shift register element is applied to the gate driver circuit as illustrated in FIG. 11, taking the shift register element as illustrated in FIG. 5 as an example, FIG. 14 illustrates a corresponding timing diagram thereof.

In a period P1, IN=1, RS=0, CK1=0, CK2=0, CK3=0, CK4=0.

Operating states of the switch transistors are the same as in the period P1 in the second example, so a repeated description thereof will be omitted here.

In a period P2, IN=0, RS=0, CK1=0, CK2=0, CK3=1, CK4=0.

Operating states of the switch transistors are the same as in the period P2 in the second example, so a repeated description thereof will be omitted here.

In a period P3, IN=0, RS=0, CK1=0, CK2=0, CK3=0, CK4=1.

Operating states of the switch transistors are the same as in the period P3 in the second example, so a repeated description thereof will be omitted here.

In a period P4, IN=0, RS=1, CK1=1, CK2=0, CK3=0, CK4=0.

Operating states of the switch transistors are the same as in the period P5 in the second example, so a repeated description thereof will be omitted here.

In a period P5, IN=0, RS=0, CK1=0, CK2=1, CK3=0, CK4=0.

Operating states of the switch transistors are the same as in the period P6 in the second example, so a repeated description thereof will be omitted here.

Thereafter until the next frame starts, the first node PUCN is held at a low level, the third node PD is held at a high level, and the second node PN is charged one time upon CK1=1 each time to charge the third node PD one time.

Furthermore for the shift register element including the discharging circuit according to the embodiment of this disclosure, e.g., the shift register element as illustrated in FIG. 6, after one frame is scanned, the level at the fourth reference level terminal VGL is changed to a high level, the Enable control terminal EN controls the eleventh switch transistor T11 to be turned on, and the turned-on eleventh switch transistor T11 transmits the high-level signal of the fourth reference level terminal VGL to the third node PD, the third node PD controls the tenth switch transistors $T10_1$ and $T10_2$ to be turned on, and the high-level signal of the fourth reference level terminal VGL is transmitted to the first output terminal OUT1 and the second output terminal OUT2 respectively through the turned-on tenth switch transistors $T10_1$ and $T10_2$, to thereby discharge the display panel.

It shall be noted that all the embodiments of this disclosure have been described by way of an example of forward scanning in a shift register element including two output circuits, and the same operating principle will apply to reverse scanning except that the timing of the clock signals of the clock signal terminals is modified accordingly, so a repeated description thereof will be omitted here.

Based upon the same disclosure idea, an embodiment of this disclosure further provides a method for driving the shift register element above, and since the driving method addresses the problem under a similar principle to the shift register element above, reference can be made to the implementation of the shift register element above for an implementation of the driving method, so a repeated description thereof will be omitted here.

Specifically the driving method according to the embodiment of this disclosure includes the following.

In an input period, the first input circuit provides the first node with the signal of the first reference level terminal under the control of the input signal terminal, and the third node control circuit provides the third node with the signal of the fourth reference level terminal under the control of the first node.

In an output period, the n-th output circuit provides the n-th output terminal with the signal of the (n+2)-th clock signal terminal under the control of the first node.

In a reset period, the second input circuit provides the first node with the signal of the second reference level terminal under the control of the reset signal terminal; the second node control circuit provides the second node with the signal of the first clock signal terminal under the control of the first reference level terminal, or provides the second node with the signal of the second clock signal terminal under the control of the second reference level terminal; and the third node control circuit provides the third node with the signal of the third reference level terminal under the control of the second node, and the first node control circuit provides the first node with the signal of the fourth reference level terminal under the control of the third node.

Specifically reference can be made to the first example to the third example above for details of the driving method above according to the embodiment of this disclosure, so a repeated description thereof will be omitted here.

Based upon the same idea, an embodiment of this disclosure further provides a display device including the gate driver circuit above according to any one of the embodiments of this disclosure. The display device according to the embodiment of this disclosure can be a mobile phone, a tablet computer, a TV set, a monitor, a notebook computer, a digital photo frame, a navigator, or any other product or component with a display function. Reference can be made to the embodiment of the gate driver circuit above for an implementation of the display device, so a repeated description thereof will be omitted here.

In the shift register element, the method for driving the same, the gate driver circuit, and the display device according to the embodiments of this disclosure, the shift register element includes the first input circuit, the second input circuit, the first node control circuit, the second node control circuit, the third node control circuit, and the N output circuits, where N is an integer more than 1, where the first input circuit is configured to control the first node according to the input signal terminal; the second input circuit is configured to control the first node according to the reset signal terminal; the first node control circuit is configured to control the first node according to the third node; and the second node control circuit is configured to control the second node according to the first clock signal terminal and the second clock signal terminal so that the third node control circuit controls the third node according to the second node and the first node, and the N output circuits are configured respectively to control the corresponding output terminals according to the corresponding clock signal terminals under the control of the first node. In the shift register element according to the embodiment of this disclosure, a plurality of output terminals are controlled using a plurality of output circuits so that a shift register element can be connected with a plurality of gate lines, and when the shift register element is applied to a display panel, the number of shift register elements can be reduced to thereby facilitate a design with a narrow bezel.

Evidently those skilled in the art can make various modifications and variations to the invention without departing from the spirit and scope of this disclosure. Thus the invention is also intended to encompass these modifications and variations thereto so long as the modifications and variations come into the scope of the claims appended to the invention and their equivalents.

The invention claimed is:

1. A shift register element, comprising:
    a first input circuit configured to provide a first node with a signal of a first reference level terminal under the control of an input signal terminal;
    a second input circuit configured to provide the first node with a signal of a second reference level terminal under the control of a reset signal terminal;
    a first node control circuit configured to provide the first node with a signal of a fourth reference level terminal under the control of a third node;
    a second node control circuit configured to provide a second node with a signal of a first clock signal terminal under the control of the first reference level terminal, and to provide the second node with a signal of a second clock signal terminal under the control of the second reference level terminal;

a third node control circuit configured to provide a third node with a signal of a third reference level terminal under the control of the second node, and to provide the third node with the signal of the fourth reference level terminal under the control of the first node; and N output circuits, wherein of the N output circuits, a n-th output circuit is configured to provide a n-th output terminal with a signal of a (n+2)-th clock signal terminal under the control of the first node, wherein n is any integer more than 0, and less than or equal to N, and N is an integer more than 1.

2. The shift register element according to claim 1, wherein the first input circuit comprises a first switch transistor, and the second input circuit comprises a second switch transistor, wherein:

the first switch transistor has a gate connected with the input signal terminal, a first electrode connected with the first reference level terminal, and a second electrode connected with the first node; and the second switch transistor has a gate connected with the reset signal terminal, a first electrode connected with the second reference level terminal, and a second electrode connected with the first node.

3. The shift register element according to claim 1, wherein the second node control circuit comprises a third switch transistor and a fourth switch transistor, wherein:

the third switch transistor has a gate connected with the first reference level terminal, a first electrode connected with the first clock signal terminal, and a second electrode connected with the second node; and the fourth switch transistor has a gate connected with the second reference level terminal, a first electrode connected with the second clock signal terminal, and a second electrode connected with the second node.

4. The shift register element according to claim 1, wherein the third node control circuit comprises a fifth switch transistor and a sixth switch transistor, wherein:

the fifth switch transistor has a gate connected with the second node, a first electrode connected with the third reference level terminal, and a second electrode connected with the third node; and the sixth switch transistor has a gate connected with the first node, a first electrode connected with the fourth reference level terminal, and a second electrode connected with the third node.

5. The shift register element according to claim 1, wherein the first node control circuit comprises a seventh switch transistor, wherein:

the seventh switch transistor has a gate connected with the third node, a first electrode connected with the fourth reference level terminal, and a second electrode connected with the first node.

6. The shift register element according to claim 1, wherein the shift register element further comprises a level holder circuit, wherein the level holder circuit comprises a first capacitor and a second capacitor, wherein:

the first capacitor is connected between the first node and the fourth reference level terminal; and the second capacitor is connected between the third node and the fourth reference level terminal.

7. The shift register element according to claim 1, wherein each of the output circuits comprises an eighth switch transistor, wherein:

in the n-th output circuit, the eighth switch transistor has a gate connected with the first node, a first electrode connected with the (n+2)-th clock signal terminal, and a second electrode connected with the n-th output terminal.

8. The shift register element according to claim 1, wherein the shift register element further comprises output reset circuits corresponding one-to-one to the output terminals, wherein:

the output reset circuit corresponding to the n-th output terminal is configured to provide the n-th output terminal with the signal of the fourth reference level terminal under the control of the third node.

9. A method for driving the shift register element according to claim 1, the method comprising:

in an input period, the first input circuit provides the first node with the signal of the first reference level terminal under the control of the input signal terminal, and the third node control circuit provides the third node with the signal of the fourth reference level terminal under the control of the first node;

in an output period, the n-th output circuit provides the n-th output terminal with the signal of the (n+2)-th clock signal terminal under the control of the first node; and in a reset period, the second input circuit provides the first node with the signal of the second reference level terminal under the control of the reset signal terminal; the second node control circuit provides the second node with the signal of the first clock signal terminal under the control of the first reference level terminal, or provides the second node with the signal of the second clock signal terminal under the control of the second reference level terminal; and the third node control circuit provides the third node with the signal of the third reference level terminal under the control of the second node, and the first node control circuit provides the first node with the signal of the fourth reference level terminal under the control of the third node.

10. A gate driver circuit, comprising at least a cascading circuit, the cascading circuit comprising a plurality of cascaded shift register elements according to claim 1, wherein:

in the cascading circuit, the N-th output terminal of each of the other shift register elements than a last shift register element is connected with the input signal terminal of a succeeding shift register element; and a first output terminal of each of the other shift register elements than a first shift register element is connected with the reset signal terminal of a preceding shift register element.

11. The shift register element according to claim 7, wherein each of the output circuits further comprises a ninth switch transistor, wherein:

the gate of the eighth switch transistor is connected with the first node through the ninth switch transistor, and a gate of the ninth switch transistor is connected with the third reference level terminal.

12. The shift register element according to claim 8, wherein the output reset circuit comprises a tenth switch transistor, wherein:

the tenth switch transistor has a gate connected with the third node, and a first electrode connected with the fourth reference level terminal; and in the output reset circuit corresponding to the n-th output terminal, the tenth switch transistor has a second electrode connected with the n-th output terminal.

13. The shift register element according to claim 8, wherein the shift register element further comprises a discharging circuit, wherein:

the discharging circuit is configured to provide the third node with the signal of the fourth reference level terminal under the control of an Enable control terminal.

14. The shift register element according to claim 13, wherein the discharging circuit comprises an eleventh switch transistor, wherein:

the eleventh switch transistor has a gate connected with the Enable control terminal, a first electrode connected with the fourth reference level terminal, and a second electrode connected with the third node.

15. The gate driver circuit according to claim 10, wherein the gate driver circuit comprises two cascading circuits, and each shift register element comprises two output circuits, wherein:

in a first cascading circuit, both the first clock signal terminal of an odd-numbered shift register element, and the third clock signal terminal of an even-numbered shift register element are connected with the fifth clock signal line; both the second clock signal terminal of the odd-numbered shift register element, and the fourth clock signal terminal of the even-numbered shift register element are connected with the sixth clock signal line; both the third clock signal terminal of the odd-numbered shift register element, and the first clock signal terminal of the even-numbered shift register element are connected with the first clock signal line; and both the fourth clock signal terminal of the odd-numbered shift register element, and the second clock signal terminal of the even-numbered shift register element are connected with the second clock signal line; and in the second cascading circuit, both the first clock signal terminal of an odd-numbered shift register element, and the third clock signal terminal of an even-numbered shift register element are connected with the seventh clock signal line; both the second clock signal terminal of the odd-numbered shift register element, and the fourth clock signal terminal of the even-numbered shift register element are connected with the eighth clock signal line; both the third clock signal terminal of the odd-numbered shift register element, and the first clock signal terminal of the even-numbered shift register element are connected with the third clock signal line; and both the fourth clock signal terminal of the odd-numbered shift register element, and the second clock signal terminal of the even-numbered shift register element are connected with the fourth clock signal line; and wherein the clock signals output at the first clock signal line to the eighth clock signal line are different sequentially in phase by one eighth of a clock cycle.

16. A display device, comprising the gate driver circuit according to claim 15.

\* \* \* \* \*